US010749550B2

(12) United States Patent
Yoshida et al.

(10) Patent No.: US 10,749,550 B2
(45) Date of Patent: Aug. 18, 2020

(54) LIKELIHOOD GENERATION DEVICE, RECEIVING APPARATUS, LIKELIHOOD GENERATION METHOD, AND OPTICAL TRANSMISSION SYSTEM

(71) Applicant: Mitsubishi Electric Corporation, Tokyo (JP)

(72) Inventors: Tsuyoshi Yoshida, Tokyo (JP); Keisuke Dohi, Tokyo (JP); Keisuke Matsuda, Tokyo (JP); Hiroshi Miura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 13 days.

(21) Appl. No.: 16/324,080

(22) PCT Filed: Sep. 1, 2016

(86) PCT No.: PCT/JP2016/075673
§ 371 (c)(1),
(2) Date: Feb. 7, 2019

(87) PCT Pub. No.: WO2018/042594
PCT Pub. Date: Mar. 8, 2018

(65) Prior Publication Data
US 2019/0181886 A1 Jun. 13, 2019

(51) Int. Cl.
*H03M 13/45* (2006.01)
*H03M 13/25* (2006.01)
(Continued)

(52) U.S. Cl.
CPC ......... *H03M 13/458* (2013.01); *H03M 13/25* (2013.01); *H03M 13/45* (2013.01);
(Continued)

(58) Field of Classification Search
CPC .... H03M 13/458; H03M 13/45; H03M 13/25; H04L 1/0047; H04L 1/006; H04L 25/068; H04L 25/067; H04L 27/38; H04L 27/3483
See application file for complete search history.

(56) References Cited

U.S. PATENT DOCUMENTS 9,735,990 B2 8/2017 Sugihara
2005/0069060 A1* 3/2005 Saito ..................... H04L 25/067
375/341
(Continued)

FOREIGN PATENT DOCUMENTS

WO WO 2015/125341 A1 8/2015

OTHER PUBLICATIONS

Agrell et al., "Power-Efficient Modulation Formats in Coherent Transmission Systems," Journal of Lightwave Technology, vol. 27, No. 22, Nov. 15, 2009, pp. 5115-5126.
(Continued)

*Primary Examiner* — Shelly A Chase
(74) *Attorney, Agent, or Firm* — Birch, Stewart, Kolasch & Birch, LLP

(57) ABSTRACT

A likelihood generation device is included in a receiving apparatus that receives a code-modulated signal including n−k information bits and k parity bits in N-dimensional arrangement, where N is a natural number greater than or equal to four, and n and k are natural numbers with k<n. The likelihood generation device includes: a temporary likelihood determination unit to determine, by using a table that includes an L-dimensional address space and stores a likelihood in each of the L-dimensional address spaces, likelihoods of an information bit and a parity bit that are transmitted by the code-modulated signal received, where L is a natural number with L<N; and a likelihood correction unit to update, among the likelihoods determined by the likelihood
(Continued)

derivation unit, the likelihood of the information bit on a basis of a rule for generation of the parity bit.

12 Claims, 12 Drawing Sheets

(51) Int. Cl.
*H04L 25/03* (2006.01)
*H04L 27/38* (2006.01)
*H04L 25/06* (2006.01)
*H04L 1/00* (2006.01)
*H04J 14/06* (2006.01)

(52) U.S. Cl.
CPC ............... *H04J 14/06* (2013.01); *H04L 1/00* (2013.01); *H04L 1/0041* (2013.01); *H04L 25/03171* (2013.01); *H04L 25/067* (2013.01); *H04L 27/38* (2013.01)

(56) References Cited

U.S. PATENT DOCUMENTS

| | | | |
|---|---|---|---|
| 2006/0104378 A1* | 5/2006 | Allpress | ............... H04L 1/0066 375/261 |
| 2016/0006515 A1 | 1/2016 | Kojima et al. | |
| 2016/0344580 A1* | 11/2016 | Konishi | ............. H04L 27/3483 |

OTHER PUBLICATIONS

Berthold et al. "100G Ultra Long Haul DWDM Framework Document," Optical Internetworking Forum. 10 pages.

Millar et al., "High-dimensional modulation for coherent optical communications systems," Optics Express, vol. 22, No. 7, Apr. 4, 2014, pp. 8798-8812.

Yamazaki et al., "Fast optical channel recovery in field demonstration of 100-Gbit/s Ethernet over OTN using real-time DSP," Optics Express, vol. 19, No. 14, Jul. 4, 2011, pp. 13179-13184.

* cited by examiner

LIKELIHOOD GENERATION DEVICE, RECEIVING APPARATUS, LIKELIHOOD GENERATION METHOD, AND OPTICAL TRANSMISSION SYSTEM

FIELD

The present invention relates to a likelihood generation device that carries out likelihood generation that is processing followed by soft decision error correction decoding. The present invention also relates to a receiving apparatus, a likelihood generation method, and an optical transmission system.

BACKGROUND

In systems where long-distance, large-capacity transmission is carried out over optical fibers, low-cost achievement of high-speed, high-density signal demultiplexing and low-cost reduction of performance degradation associated with the transmission are challenging.

Transmission capacity per optical fiber can be increased if an optical transmission apparatus that transmits optical signals carries out dense wavelength multiplexing in order to make a plurality of optical carrier waves or optical sub-carrier waves, which are sub-carriers, carry different information items. The optical carrier waves and the optical sub-carrier waves that undergo multiplexing here are referred to as channels. Furthermore, the transmission capacity can also be increased even by using multi-level modulation.

Conceivable methods for achieving long-distance transmission and large-capacity transmission include using m-ary phase-shift keying (mPSK) and using m-ary quadrature amplitude modulation (mQAM). In other words, an increased number of constellation points for an increased number of transmission bits per symbol enables increased transmission capacity. In mPSK and mQAM, a signal is typically assigned to an in-phase axis (I axis) and a quadrature-phase axis (Q axis).

Polarization multiplexing is a known method of doubling the number of transmission bits per symbol. With polarization multiplexing, a signal can be assigned to two independent orthogonal polarization components, namely, a vertically polarized wave and a horizontally polarized wave.

In an optical transmission system where polarization multiplexing mPSK or polarization multiplexing mQAM is used, a receiving end uses a digital coherent method in which mixed interference is caused between a receive signal and continuous light produced by a local oscillation light source for coherent detection, and the electrical signal obtained by the coherent detection undergoes digital signal processing for compensation. In the digital coherent method, dual-polarization (DP) quadrature PSK (QPSK) is widely used (refer to, for example, Non-Patent Literatures 1 and 2).

In mPSK and mQAM, m is typically two raised to the power n (n: an integer greater than or equal to one), and thus n-bit information communication is enabled. Meanwhile, restricting typical signal constellations in mPSK and mQAM to improve the performance is code modulation that is being examined (refer to, for example, Non-Patent Literatures 3 and 4). In the simplest conceivable example, bits for communication in one block are (n−1) in number, and constellation points are prepared for the n bits in that one block. The (n−1) bits for communication are exclusive-ORed for generation of one parity bit to carry out communication using constellation points for n bits. Working on, for example, two orthogonal polarizations, two orthogonal phases, and a plurality of time slots all together is a typical method of constructing a block. N-dimensional modulation is the name used when coordinate axes are N in number. N is an integer greater than or equal to one. The N-dimensional modulation has a limited improvement in performance compared with an error correction code that has a long code length. However, the N-dimensional modulation is advantageous in that the number of information bits and the number of parity bits can be varied in relation to each other, so that spectral efficiency can be flexibly varied. For example, polarization switched-QPSK (PS-QPSK) that achieves three bits per symbol is a predominant intermediate solution between typical DP-QPSK that achieves four bits per symbol and DP-binary phase-shift keying (DP-BPSK) that achieves two bits per symbol.

In long-distance optical transmission, it is necessary to achieve the optical signal-to-noise ratio that corresponds to, for example, a bit rate, modulation, and a detection method in order to ensure the signal quality at a receiving end. To this end, signal transmission requires high optical power, and when this is the case, waveform distortion ascribable to nonlinear optical effects in the optical fiber causes degraded signal quality. The nonlinear optical effects can be classified broadly into effects that take place in a channel and effects that take place between channels.

Self-phase modulation (SPM) is one example a nonlinear optical effect that takes place in a channel. In narrower definitions, SPM is classified as intra-channel SPM (ISPM), intra-channel cross-phase modulation (IXPM), intra-channel four-wave mixing (IFWM), or the like. Furthermore, non-linear optical effects that take place between channels include cross-phase modulation (XPM), four-wave mixing (FWM), and cross-polarization modulation (XPolM). The nonlinear optical effects more markedly take place in a channel and between channels when a signal is of high optical power density, when the optical power density of a signal varies greatly, and when the transmission distance is long. Moreover, in the case of the nonlinear optical effects that take place between channels, there is a long correlation between polarization states of respective optical signals of the channels in a transmission line when local chromatic dispersion is small in the transmission line or when the wavelength spacing between channels that undergo wavelength multiplexing is small. Continued interaction leads to markedly degraded quality.

By restricting the possible combination of constellation points, code modulation reduces power variation in optical signals and thus can also improve tolerance to the nonlinear optical effects. In the 4-dimensional 2-ary amplitude 8-ary PSK (4D-2A8PSK) described in Patent Literature 1, for example, four dimensions formed by two orthogonal polarizations, two orthogonal phases, and one time slot form one block, and each of the polarizations has a 2-ary amplitude 8-ary PSK (2A8PSK) signal constellation. With 4D-2A8PSK, bits used communication in one block are six in number, and constellation points are 256 in number for eight bits in that one block. FIG. 13 illustrates bit mapping and symbol mapping for 4D-2A8PSK. The left side of FIG. 13 illustrates a 4D-2A8PSK signal constellation in an X-polarization plane as well as in a Y-polarization plane, and the correspondence between four bits to transmit and each of the constellation points. Each of the three bits on the left side of the comma are information bits, while a single bit on the right side of the comma is a parity bit. As illustrated in FIG. 13, in communication using 4D-2A8PSK, of the six information bits for communication, three bits are Gray-coded and are assigned to the phase of an X-polarized wave, and the other three bits are Gray-coded similarly and are assigned to the phase of a Y-polarized wave. Moreover, these six bits are exclusive-ORed to generate one parity bit that is assigned to the amplitude of the X-polarized wave, and a second parity bit is obtained by inversion of the first parity bit assigned to the amplitude of the X-polarized wave and is assigned to the amplitude of the Y-polarized wave. In this way, with 4D-2A8PSK, the eight bits in total are transmitted in one block. As such, optical signal power per time slot is constant with respect to any bit combination. Although 4D-2A8PSK that achieves the constant optical signal power can achieve a spectral efficiency of six bits per symbol, which is the same as that of DP-8QAM, 4D-2A8PSK has high tolerance to the nonlinear optical effects compared with DP-8QAM with which optical signal power varies depending on bit combination. The 4D-2A8PSK that allows transmission of six information bits in one block is hereinafter referred to as 6b4D-2A8PSK.

CITATION LIST

Patent Literature

Patent Literature 1: U.S. Patent Application Publication No. 2016/0006515

Non-Patent Literatures

Non-Patent Literature 1: Optical Internetworking Forum, "100G Ultra Long Haul DWDM Framework Document", June 2009
Non-Patent Literature 2: E. Yamazaki and 27 others, "Fast optical channel recovery in field demonstration of 100-Gbit/s Ethernet (registered trademark) over OTN using real-time DSP", Optics Express, vol. 19, no. 14, pp. 13179-13184, 2011
Non-Patent Literature 3: E. Agrell and one other, "Power-Efficient Modulation Formats in Coherent Transmission Systems", Journal of Lightwave Technology, vol. 27, no. 22, pp. 5115-5126, 2009
Non-Patent Literature 4: D. Millar and six others, "High-dimensional modulation for coherent optical communications systems", Optics Express, vol. 22, no. 7, pp. 8798-8812, 2014

SUMMARY

Technical Problem

The conventional technique (6b4D-2A8PSK) described in Patent Literature 1 assumes that likelihood generation with the assumption that soft decision error correction is used is ideal likelihood generation, and implementation of the circuit is not taken into account. In other words, the conventional technique described in Patent Literature 1 does not take the circuit implementation into consideration. As such, with the conventional technique described in Patent Literature 1, there is a problem in that scale of the signal processing circuit for likelihood generation increases and thus the circuit is difficult to implement.

The present invention has been made in view of the above, and an object of the present invention is to obtain a likelihood generation device with a circuit of reduced scale.

Solution to Problem

To solve the above-mentioned problem and to achieve the object, a likelihood generation device according to the present invention is included in a receiving apparatus that receives a code-modulated signal including n–k information bits and k parity bits in N-dimensional arrangement, where N is a natural number greater than or equal to four, and n and k are natural numbers with k<n. The likelihood generation device determines, by using a table that includes an L-dimensional address space and stores a likelihood in each of the L-dimensional address spaces, likelihoods of an information bit and a parity bit that are transmitted by the code-modulated signal received, where L is a natural number with L<N. The likelihood generation device updates, among the determined likelihood information items, the likelihood of the information bit on the basis of a rule for generation of the parity bit.

Advantageous Effect of Invention

The present invention can achieve implementation of a likelihood generation device with a circuit of reduced scale.

DESCRIPTION OF EMBODIMENTS

With reference to the drawings, a detailed description is hereinafter provided of a likelihood generation device, a receiving apparatus, a likelihood generation method, and an optical transmission system according to embodiments of the present invention. It is to be noted that these embodiments are not restrictive to the present invention.

First Embodiment

Figure 1:
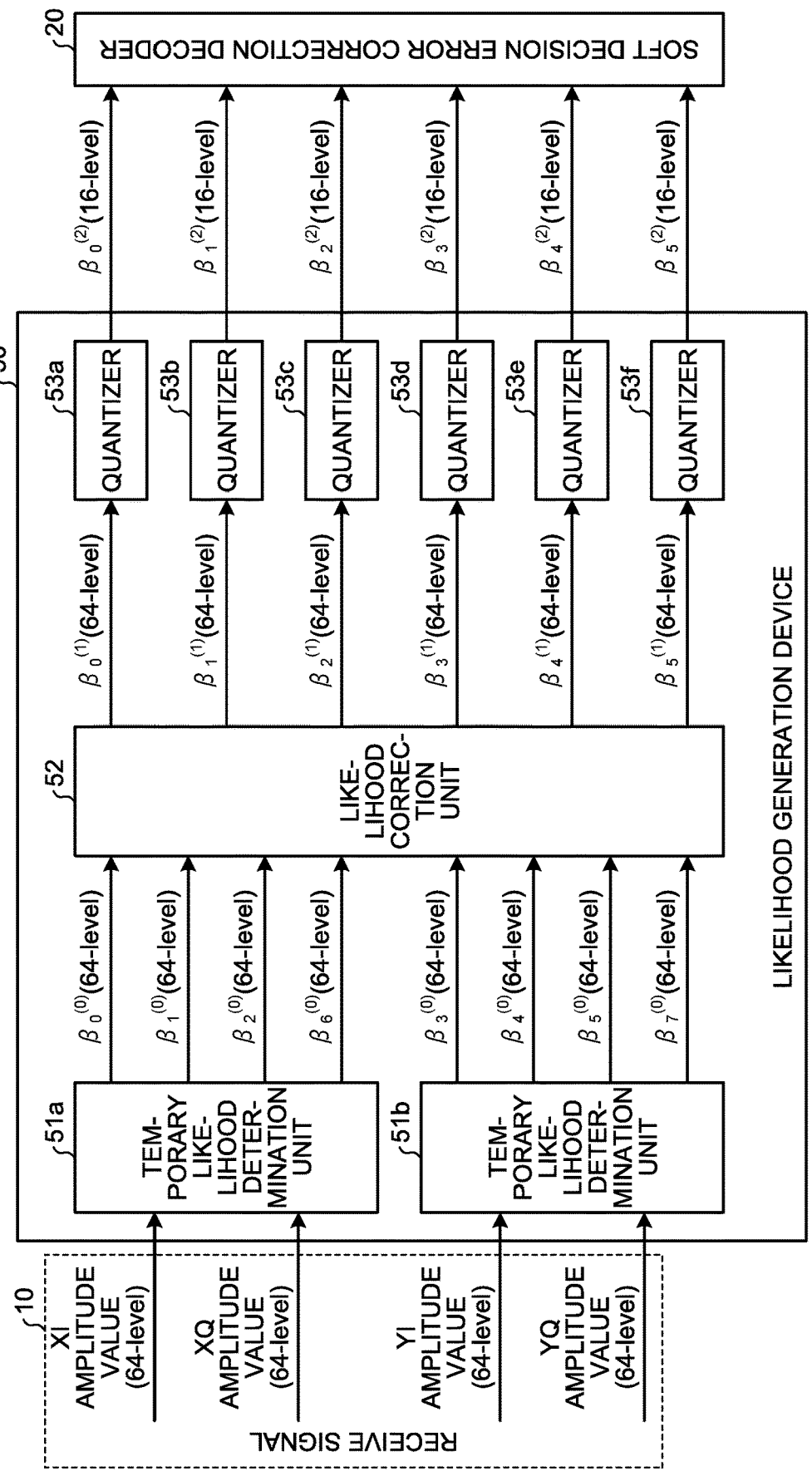
FIG. 1 is a diagram illustrating an example configuration of a likelihood generation device according to a first embodiment of the present invention.

FIG. 1 is a diagram illustrating an example configuration of a likelihood generation device according to a first embodiment of the present invention. In the present embodiment, a description is provided of a likelihood generation device that generates likelihoods for a receive signal in an optical receiving apparatus of an optical transmission system where a 6b4D-2A8PSK signal that achieves six bits per symbol is transmitted, that is to say, a signal is transmitted with four dimensions formed by two orthogonal polarizations, two orthogonal phases, and one time slot forming one block. It is to be noted that a 6b4D-2A8PSK signal is not restrictive to a signal format to which the present invention is applicable.

A likelihood generation device 50 receives a receive signal 10 formed of XI, XQ, YI, and YQ components that are each represented by 64 gradations (64 levels). The likelihood generation device 50 generates likelihood information items on six information bits included in the input receive signal 10 and outputs the generated six likelihood information items to a subsequent-stage soft decision error correction decoder 20. In the example in FIG. 1, the likelihood generation device 50 outputs 16-value or 16-level likelihood information items. The receive signal 10 is a signal that is obtained as a result of coherent detection of an optical signal transmitted from an optical transmission apparatus, which is a counter apparatus, and digital signal processing of an electrical signal obtained by the coherent detection for waveform compensation and signal recovery. The coherent detection of the optical signal and the digital signal processing of the electrical signal obtained by the coherent detection are carried out following a publicly known method described, for example, in Non-Patent Literature 1 or Non-Patent Literature 2. The soft decision error correction decoder 20 carries out error correction decoding following a publicly known method to recover the six information bits.

As illustrated in FIG. 1, the likelihood generation device 50 includes temporary likelihood determination units 51*a* and 51*b*, a likelihood correction unit 52, and quantizers 53*a* to 53*f*. An XI amplitude value and an XQ amplitude value are input as signal components of an X-polarized wave to the temporary likelihood determination unit 51*a*, and a YI amplitude value and a YQ amplitude value are input as signal components of a Y-polarized wave to the temporary likelihood determination unit 51*b*. The temporary likelihood determination units 51*a* and 51*b* form a likelihood derivation unit.

Figure 13:
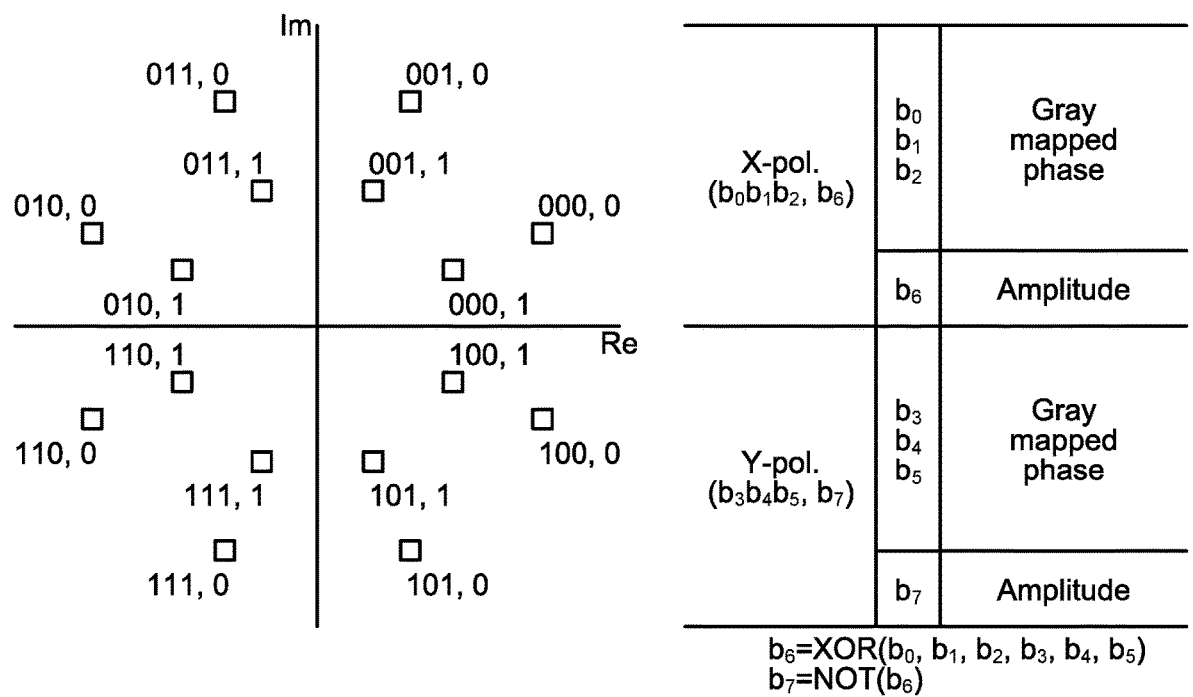
FIG. 13 is a diagram illustrating bit mapping and symbol mapping for 4D-2A8PSK.

The temporary likelihood determination unit 51*a* outputs, to the likelihood correction unit 52, bit likelihood information items that are predetermined to correspond to each of 4096 addresses represented in a two-dimensional space by XI amplitude values (64 levels each) and XQ amplitude values (64 levels each) that may be input. The temporary likelihood determination unit 51*a* stores a table that stores the likelihoods $\beta_0^{(0)}$, $\beta_1^{(0)}$, $\beta_2^{(0)}$, and $\beta_6^{(0)}$ that respectively correspond to bits $b_0$, $b_1$, $b_2$, and $b_6$ (illustrated in FIG. 13) for an X-polarized wave. In other words, the temporary likelihood determination unit 51*a* stores the table of correspondence between each of those 4096 addresses represented by the XI and XQ amplitude values and the likelihoods $\beta_0^{(0)}$, $\beta_1^{(0)}$, $\beta_2^{(0)}$, and $\beta_6^{(0)}$ and outputs, to the likelihood correction unit 52, likelihoods $\beta_0^{(0)}$, $\beta_1^{(0)}$, $\beta_2^{(0)}$, and $\beta_6^{(0)}$ corresponding to the address represented by the input XI and XQ amplitude values. In the example in FIG. 1, each of those likelihoods is represented by 64 gradations.

The temporary likelihood determination unit 51*b* outputs, to the likelihood correction unit 52, bit likelihood information items that are predetermined to correspond to each of 4096 addresses represented in a two-dimensional space by YI amplitude values and YQ amplitude values that may be input. The temporary likelihood determination unit 51*b* stores a table that stores the likelihoods $\beta_3^{(0)}$, $\beta_4^{(0)}$, $\beta_5^{(0)}$, and $\beta_7^{(0)}$ that respectively correspond to bits $b_3$, $b_4$, $b_5$, and $b_7$ (illustrated in FIG. 13) for a Y-polarized wave. In other words, the temporary likelihood determination unit 51*b* stores the table of correspondence between each of those 4096 addresses represented by the YI and YQ amplitude values and the likelihoods $\beta_3^{(0)}$, $\beta_4^{(0)}$, $\beta_5^{(0)}$, and $\beta_7^{(0)}$ and outputs, to the likelihood correction unit 52, likelihoods $\beta_3^{(0)}$, $\beta_4^{(0)}$, $\beta_5^{(0)}$, and $\beta_7^{(0)}$ corresponding to the address represented by the input YI and YQ amplitude values. In the example in FIG. 1, each of those likelihoods is represented by 64 gradations.

The likelihood information items that are stored in the tables in the temporary likelihood determination units 51*a* and 51*b* are determined in consideration of at least one of those including noise distribution and signal distortion that are conceivable in the optical transmission system where the likelihood generation device 50 is applied, and performance of the soft decision error correction decoder 20 disposed in the subsequent stage. The noise distribution corresponds to at least one of those including a distribution of additive white Gaussian noise, a distribution of light source phase noise that remains after signal processing, and a distribution of polarized wave interference noise. The signal distortion corresponds to at least one of those including the extinction ratio of an optical modulator, nonlinear responses of an optical modulator driver and a coherent receiver of an optical receiver, an I/Q skew, namely, a skew between an in-phase component and a quadrature component, an I/Q power variation, and an X/Y power variation, namely, a power variation between an X-polarization component and a Y-polarization component. The performance of the error correction decoder is, for example, noise power caused when the bit error rate of $10^{-15}$ is obtained after error correction.

Figure 2:
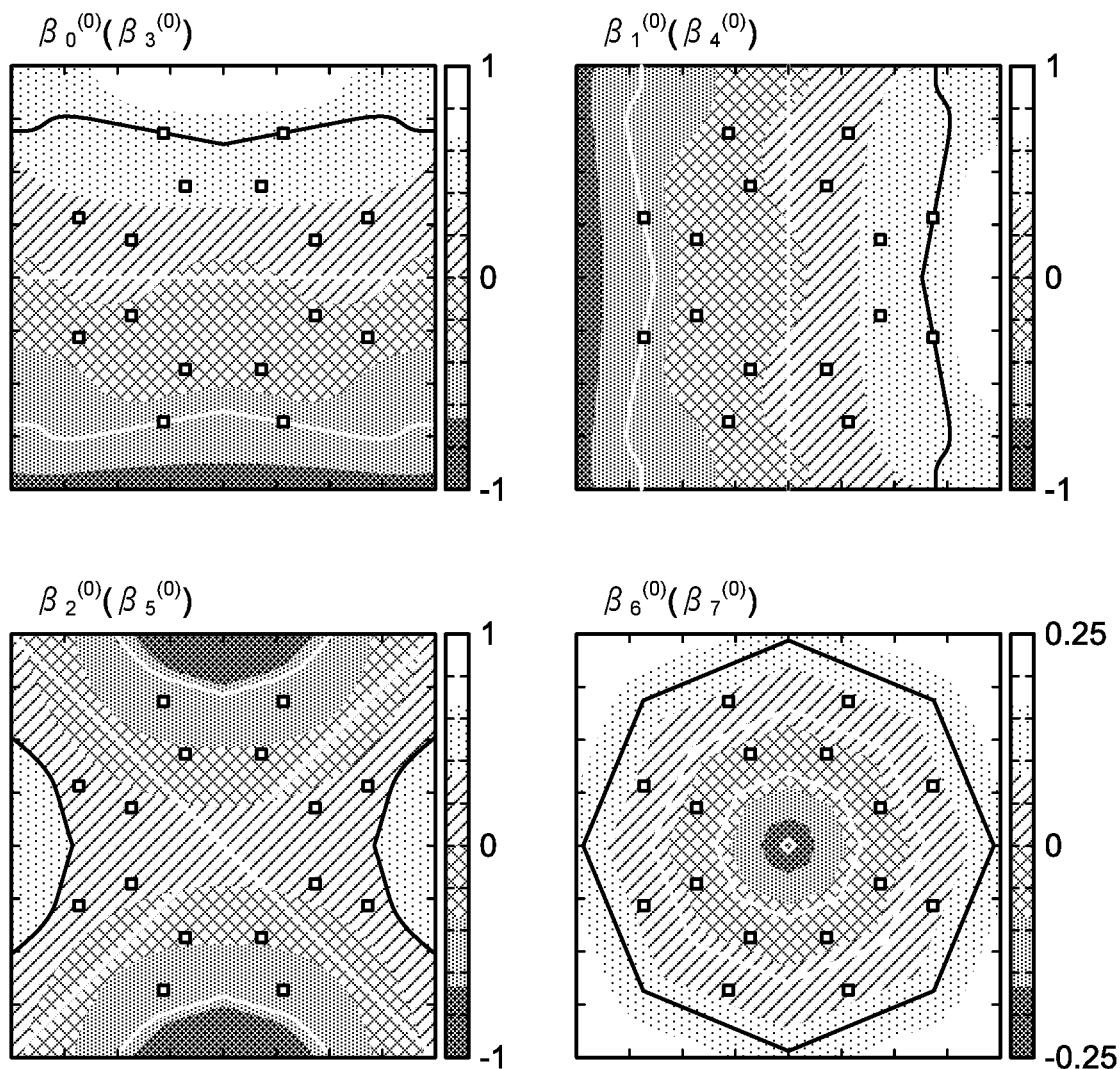
FIG. 2 is a diagram illustrating examples of bit likelihood information items stored in tables in temporary likelihood determination units according to the first embodiment.

FIG. 2 is a diagram illustrating examples of the bit likelihood information items stored in the tables in the temporary likelihood determination units 51*a* and 51*b*. The likelihood information items $\beta_0^{(0)}$ and $\beta_3^{(0)}$ are illustrated in the upper left part of FIG. 2, the likelihood information items $\beta_1^{(0)}$ and $\beta_4^{(0)}$ are illustrated in the upper right part of FIG. 2, the likelihood information items $\beta_2^{(0)}$ and $\beta_5^{(0)}$ are illustrated in the lower left part of FIG. 2, and the likelihood information items $\beta_6^{(0)}$ and $\beta_7^{(0)}$ are illustrated in the lower right part of FIG. 2. In each of the four illustrated examples of the likelihood information items, the positions of constellation points for 6b4D-2A8PSK are illustrated, and the normalized log-likelihood ratio (LLR) is illustrated by shading. For convenience' sake, differences in shading are represented by differences in hatching in FIG. 2. Each of the tables in the temporary likelihood determination units 51*a* and 51*b* stores the likelihood information items on each of the bits (four bits in total), indicating the constellation points. With the 6b4D-2A8PSK signal, bit mapping and symbol mapping are completely consistent between the X-polarized wave and the Y-polarized wave, so that the table for the X-polarized wave is the same as the table for the Y-polarized wave, and the temporary likelihood determination units 51a and 51b only need to carry out the same processing.

The tables stored in the temporary likelihood determination units 51a and 51b are rewritable from external devices. A conceivable means of rewriting is such that the likelihood generation device 50 is provided with an interface for connection to an external device to obtain data of the tables from the external device. Data of the tables may be input as the receive signal 10 so that the temporary likelihood determination units 51a and 51b may receive the data (new table data) that have been decoded by the subsequent-stage soft decision error correction decoder 20 to update the tables. The data of the tables may be updated by yet another method.

To determine the likelihood information items on the original six bits ($b_0$ to $b_5$), the likelihood correction unit 52 performs likelihood change on the eight bit likelihood information items $\beta_i^{(0)}$ (i=0 to 7) input from the temporary likelihood determination units 51a and 51b on the basis of the rules for generation of the two parity bits $b_6$ and $b_7$, namely, "$b_6$=XOR($b_0,b_1,b_2,b_3,b_4,b_5$)" and "$b_7$=NOT ($b_6$) =XOR($b_0,b_1,b_2,b_3,b_4,b_5$,1)". The likelihood correction unit 52 outputs the determined likelihood information items to the quantizers 53a to 53f. The bit precision of, for example, 64 gradations is achieved here. It is to be noted that the precision may be increased to, for example, 256 gradations or 512 gradations according to circuit resources.

The likelihood change with respect to the eight bits that are constrained by the rules for generation of the parity bits $b_6$ and $b_7$, that is to say, the parity generation rules expressed by the two XORs, can be performed according to the following Formulas (1) to (3), using, for example, a publicly known min-sum method.

[Formula 1]

$$a_{i,6} = \prod_{k=s(6), k \neq i} \text{sgn}(\beta_k^{(0)}) \min_{k=s(6), k \neq i} |\gamma_k \beta_k^{(0)}| \qquad (1)$$

$$a_{i,7} = -\prod_{k=s(7), k \neq i} \text{sgn}(\beta_k^{(0)}) \min_{k=s(7), k \neq i} |\gamma_k \beta_k^{(0)}| \qquad (2)$$

$$\beta_i^{(1)} = \beta_i^{(0)} + \varepsilon(a_{i,6} + a_{i,7}) \qquad (3)$$

$\alpha_{i,6}$ determined by Formula (1) is an extrinsic information item on the bit $b_i$ (i=0 to 5) relating to the parity bit $b_6$, and $\alpha_{i,7}$ determined by Formula (2) is an extrinsic information item on the bit $b_i$ (i=0 to 5) relating to the parity bit $b_7$. $\gamma_1$ to $\gamma_7$ are coefficients used to weight the likelihood of each of the bits. s(6) represents the bits relating to the parity bit $b_6$, namely, the bits $b_0$ to $b_6$, and s(7) represents the bits relating to the parity bit $b_7$, namely, the bits $b_0$ to $b_5$, and $b_7$.

In Formula (3), the extrinsic information items $\alpha_{i,6}$ and $\alpha_{i,7}$ on the bits $b_i$ (i=0 to 5) determined by Formulas (1) and (2) are added together, and the result obtained by multiplying the result of the addition by a weight $\varepsilon$ is added to the original likelihood information item $\beta_i^{(0)}$ (i=0 to 5). Formula (3) expresses such processing to determine a likelihood information item for output, namely, an updated likelihood information item $\beta_i^{(1)}$.

The above parameters $\gamma_k$ and $\varepsilon$ use, as an index, mutual information that is observed or the bit error rate after soft decision error correction that is observed. In cases where the mutual information is used as an index, the parameters are selected to maximize the mutual information. In cases where the bit error rate is used as an index, the parameters are selected to minimize the bit error rate.

The quantizers 53a to 53f quantize the six bit likelihood information items $\beta_i^{(1)}$ (i=0 to 5, and 64 gradations each, for example) input from the likelihood correction unit 52 to perform conversion to, for example, 16-gradation likelihood information items. The quantizers 53a to 53f output, to the soft decision error correction decoder 20, the likelihood information items $\beta_i^{(2)}$ (i=0 to 5) that are obtained by the quantization and have their bit resolutions changed. For scaling during quantization, mutual information between $\beta_i^{(1)}$ and $\beta_i^{(2)}$ or the bit error rate obtained after the soft decision error correction is used as an index. In cases where the mutual information is used as an index, the parameters are selected to maximize the mutual information. In cases where the bit error rate is used as an index, the parameters are selected to minimize the bit error rate. The quantizer 53a quantizes the likelihood information item $\beta_0^{(1)}$ to generate the likelihood information item $\beta_0^{(2)}$. The quantizer 53b quantizes the likelihood information item $\beta_1^{(1)}$ to generate the likelihood information item $\beta_1^{(2)}$. The quantizer 53c quantizes the likelihood information item $\beta_2^{(1)}$ to generate the likelihood information item $\beta_2^{(2)}$. The quantizer 53d quantizes the likelihood information item $\beta_3^{(1)}$ to generate the likelihood information item $\beta_3^{(2)}$. The quantizer 53e quantizes the likelihood information item $\beta_4^{(1)}$ to generate the likelihood information item $\beta_4^{(2)}$. The quantizer 53f quantizes the likelihood information item $\beta_5^{(1)}$ to generate the likelihood information item $\beta_5^{(2)}$.

Figure 3:
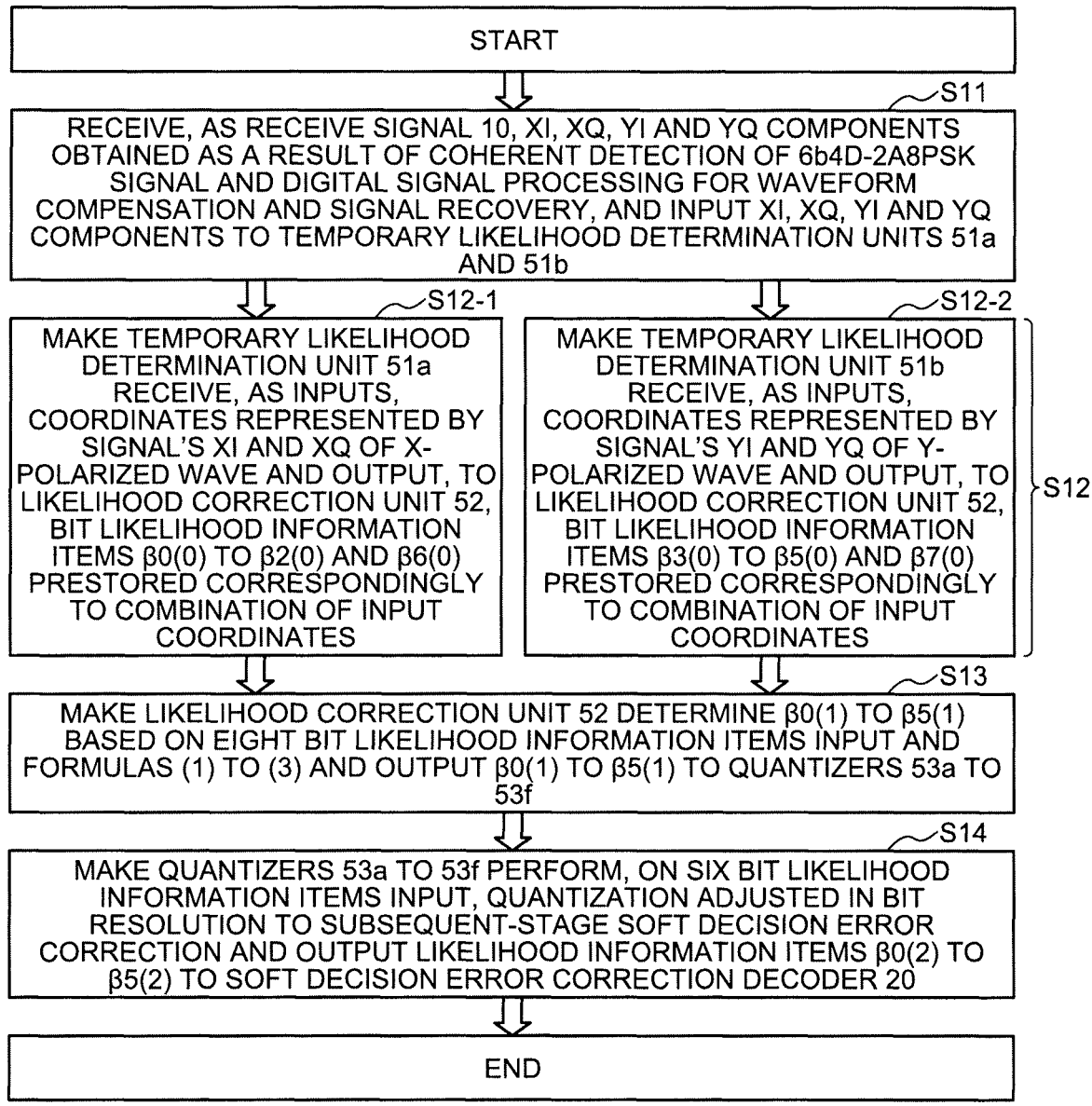
FIG. 3 is a flowchart illustrating an example of a processing procedure in the likelihood generation device according to the first embodiment.

FIG. 3 is a flowchart illustrating an example of a processing procedure in the likelihood generation device 50 according to the first embodiment.

First, the likelihood generation device 50 receives XI, XQ, YI, and YQ signal components as the receive signal 10. The XI signal component, the XQ signal component, the YI signal component, and the YQ signal component are components of the signal that is obtained as a result of coherent detection of a 6b4D-2A8PSK signal by means of, for example, a preceding-stage coherent receiver (omitted from FIG. 1) and digital signal processing for waveform compensation and signal recovery. Among the signal components received by the likelihood generation device 50, the XI component and the XQ component are input to the temporary likelihood determination unit 51a, and the YI component and the YQ component are input to the temporary likelihood determination unit 51b (step S11).

Next, the temporary likelihood determination units 51a and 51b determine, by referring to their tables, likelihoods corresponding to addresses that are represented by the values of the input receive signal 10, that is to say, constellation points, and output the likelihoods to the likelihood correction unit 52 (step S12). In other words, the temporary likelihood determination unit 51a determines the likelihoods corresponding to the address represented by the input XI component and the input XQ component by referring to the table and outputs the likelihoods $\beta_0^{(0)}$, $\beta_1^{(0)}$, $\beta_2^{(0)}$, and $\beta_6^{(0)}$ to the likelihood correction unit 52 (step S12-1). The temporary likelihood determination unit 51b determines the likelihoods corresponding to the address represented by the input YI component and the input YQ component by referring to the table and outputs the likelihoods $\beta_3^{(0)}$, $\beta_4^{(0)}$, $\beta_5^{(0)}$, and $\beta_7^{(0)}$ to the likelihood correction unit 52 (step S12-2).

Next, the likelihood correction unit 52 determines, based on the input eight bit likelihood information items and Formulas (1) to (3), likelihoods $\beta_0^{(1)}$ to $\beta_5^{(1)}$ the information bits of which have been corrected and outputs the likelihoods $\beta_0^{(1)}$ to $\beta_5^{(1)}$ to the quantizers 53a to 53f (step S13).

Next, the quantizers 53a to 53f quantize the likelihoods $\beta_0^{(1)}$ to $\beta_5^{(1)}$ input from the likelihood correction unit 52 to change bit resolutions, and generate and output likelihoods $\beta_0^{(2)}$ to $\beta_5^{(2)}$ having bit resolutions adjusted to bit resolution in the subsequent-stage soft decision error correction decoder 20 (step S14).

As described above, the likelihood generation device 50 according to the present embodiment divides the receive signal that has undergone four-dimensional modulation into the polarization-based components and determines the likelihood of each of the received bits by referring to the two-dimensional tables for each of the components. The receive signal includes the information bits and the parity bits. Based on the parity-bit likelihoods and the parity bit generation rules, the likelihood generation device 50 corrects the information-bit likelihoods obtained by reference to the tables. The likelihood generation device 50 also quantizes the corrected information-bit likelihoods, adjusts the likelihoods' resolutions to correspond to the bit resolution in the subsequent-stage soft decision error correction decoder 20, and then outputs the likelihood information items.

A description is provided of effects of the present embodiment. In cases where respective likelihoods of bits in a receive signal that has undergone four-dimensional modulation are determined by table reference, it is assumed that a likelihood for each bit corresponding to a constellation point is prepared by being stored in a four-dimensional table. If the coordinate axes of the receive signal each have 64 gradations, coordinates of the constellation points are 64 raised to the power four=1677216 in number. This means that 1677216 addresses are required in the four-dimensional table and thus makes implementation difficult. Although the number of addresses can be reduced by making each of the axes have a reduced number of gradations, in that case, a problem occurs in that the performance of soft decision error correction degrades. In contrast, the likelihood generation device 50 according to the present embodiment divides the components of the receive signal into two and uses two two-dimensional tables to determine the likelihoods, so that even when coordinate axes of the receive signal each have 64 gradations, the addresses required in each of the tables are 64 raised to the power two =4096. As such, with the performance of soft decision error correction maintained, the likelihood generation device 50 can have the tables of reduced sizes and can prevent a circuit from being increased in scale. Moreover, the use of the tables to determine the likelihoods can prevent an increase of computation required for likelihood determination.

While the 6b4D-2A8PSK signal has been given as an example in the present embodiment, the present embodiment is also applicable to other code modulations. In cases where the number of bits to be modulated is changed to the number other than six and in cases where the number of dimensions in modulation is changed from four to a different number, it is sufficient to change the number of bits to be processed by each of those blocks including the temporary likelihood determination units 51a and 51b, the likelihood correction unit 52, and the quantizers 53a to 53f accordingly. In such cases, the temporary likelihood determination units 51a and 51b each use a table having a smaller number of dimensions than the number of dimensions of a modulated receive signal and share determination of likelihoods associated with signal components of the receive signal. The number of temporary likelihood determination units, that is to say, the number of tables to use for likelihood determination, may be greater than or equal to three.

Second Embodiment

Figure 4:
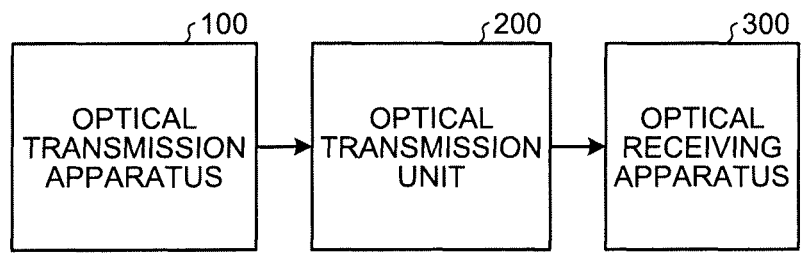
FIG. 4 is a diagram illustrating an example configuration of an optical transmission system according to a second embodiment of the present invention.

FIG. 4 is a diagram illustrating an example configuration of an optical transmission system according to a second embodiment of the present invention. In the present embodiment, a description is provided of an example of the optical transmission system where a 6b4D-2A8PSK signal is transmitted. An optical transmission system 1 includes an optical transmission apparatus 100 that transmits optical signals; an optical transmission unit 200 that is a transmission line configured to include an optical fiber, an optical repeater, and the like; and an optical receiving apparatus 300 that receives the optical signals. In the optical transmission system 1, when an optical signal is transmitted from the optical transmission apparatus 100, the optical receiving apparatus 300 as a receiving apparatus according to the present invention receives the optical signal via the optical transmission unit 200. In the example in FIG. 4, the optical transmission apparatus 100 constitutes an optical-signal-transmitting-end optical communication apparatus, while the optical receiving apparatus 300 constitutes an optical-signal-receiving-end optical communication apparatus.

Figure 5:
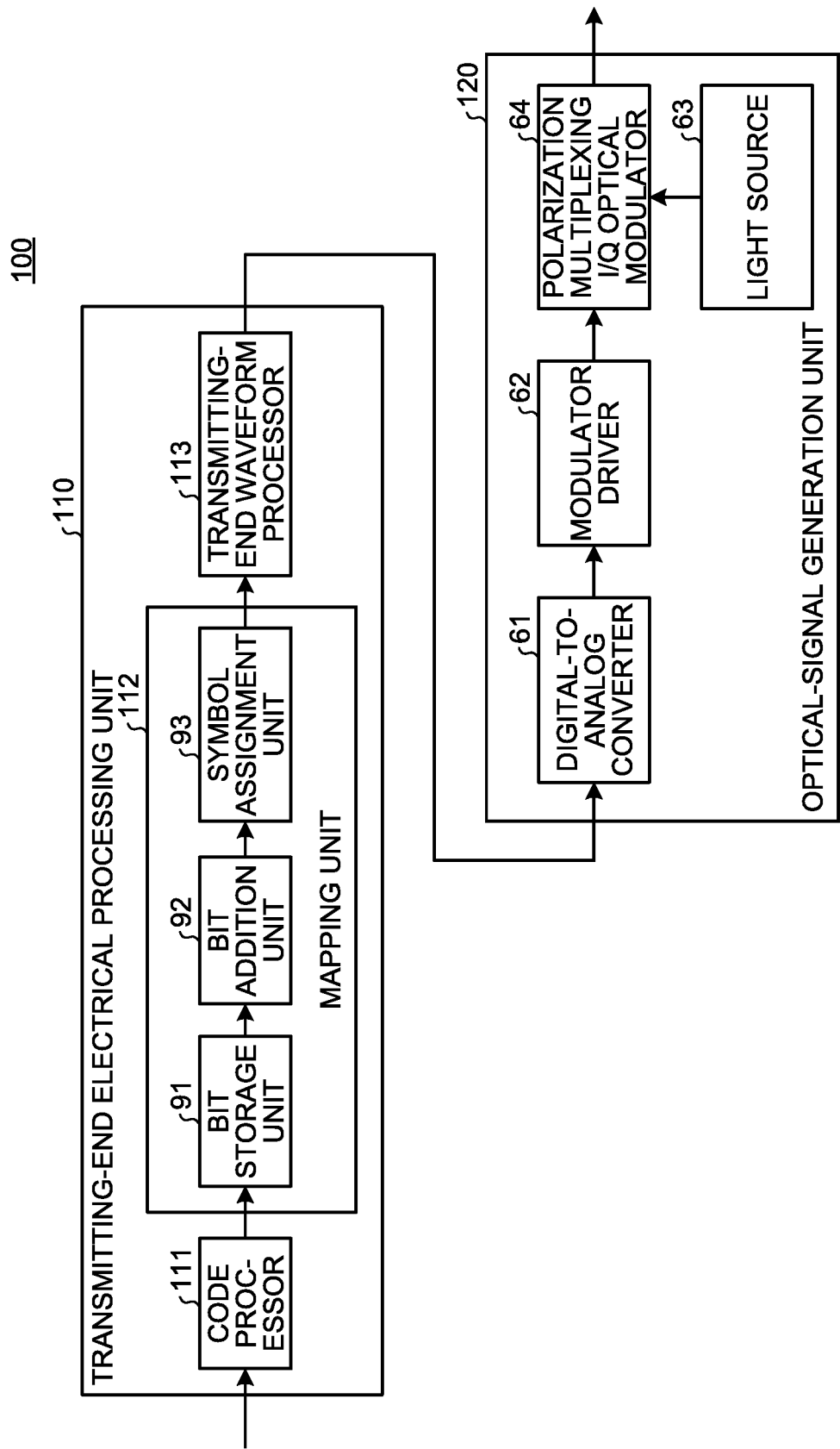
FIG. 5 is a diagram illustrating an example configuration of an optical transmission apparatus according to the second embodiment.

FIG. 5 is a diagram illustrating an example configuration of the optical transmission apparatus 100 according to the second embodiment. The optical transmission apparatus 100 includes a transmitting-end electrical processing unit 110 that generates an electrical signal including information bits to transmit, and an optical-signal generation unit 120 that converts the electrical signal generated by the transmitting-end electrical processing unit 110 to an optical signal.

The transmitting-end electrical processing unit 110 of the optical transmission apparatus 100 includes a code processor 111, a mapping unit 112, and a transmitting-end waveform processor 113. The mapping unit 112 includes a bit storage unit 91, a bit addition unit 92, and a symbol assignment unit 93.

The optical-signal generation unit 120 of the optical transmission apparatus 100 includes a digital-to-analog converter 61, a modulator driver 62, a light source 63, and a polarization multiplexing I/Q optical modulator 64.

Figure 6:
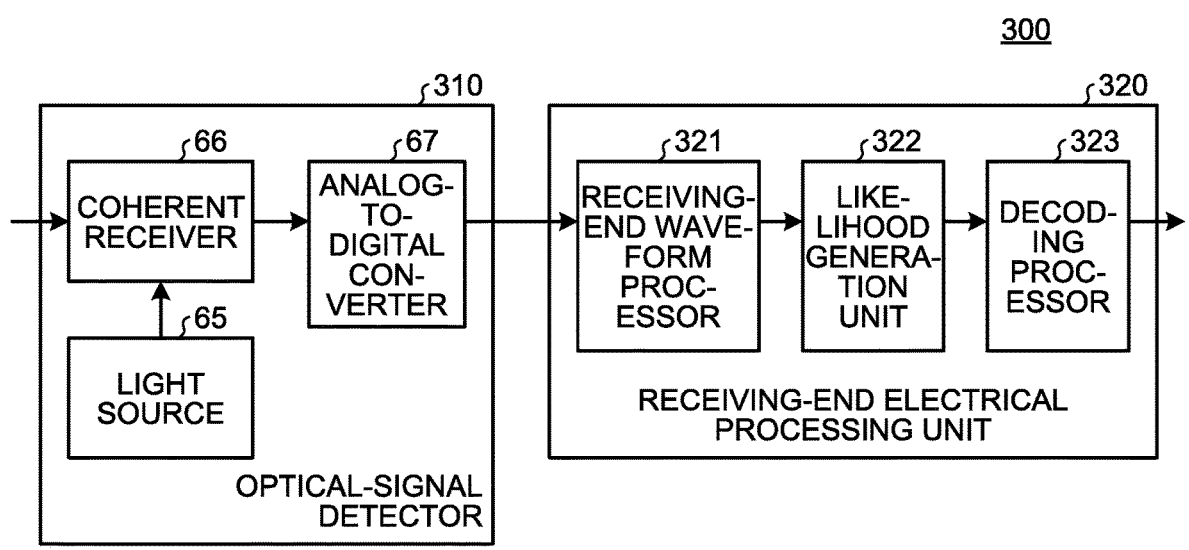
FIG. 6 is a diagram illustrating an example configuration of an optical receiving apparatus according to the second embodiment.

FIG. 6 is a diagram illustrating an example configuration of the optical receiving apparatus 300 according to the second embodiment. The optical receiving apparatus 300 includes an optical-signal detector 310 that receives the optical signal transmitted by the optical transmission apparatus 100 and converts the optical signal to an electrical signal, and a receiving-end electrical processing unit 320 that recovers information bits included in the receive signal that has been converted by the optical-signal detector 310 to the electrical signal.

The optical-signal detector 310 of the optical receiving apparatus 300 includes a light source 65, a coherent receiver 66, and an analog-to-digital converter 67.

The receiving-end electrical processing unit 320 of the optical receiving apparatus 300 includes a receiving-end waveform processor 321, a likelihood generation unit 322, and a decoding processor 323.

A description will be next given of the operation of the optical transmission system 1, namely, operation in which an optical signal is transmitted from the optical transmission apparatus 100 and is received by the optical receiving apparatus 300 via the optical transmission unit 200.

The optical transmission apparatus 100 generates an optical signal and outputs to the optical signal to the optical transmission unit 200 according to the procedure that is as follows.

In the optical transmission apparatus 100, the code processor 111 of the transmitting-end electrical processing unit 110 performs error correction coding on a logic signal that is a binary data signal input from an external device. After the error correction coding, the code processor 111 outputs the resulting logic signal to the mapping unit 112.

The logic signal that is input to the code processor 111 is, for example, an Optical Transport Unit Level 4 (OTU4) framed data signal. In the error correction coding, the code processor 111, for example, stores several frames of the OTU4 framed signal, applies interleaving or the like for bit rearrangement, computes parity bits by means of a low density parity check (LDPC) code with a redundancy of about 25% or 50%, and adds the parity bits to the logic signal.

The mapping unit 112 works on the logic signal that has undergone the error correction coding in six-bit units to carry out mapping. Specifically, the bit storage unit 91 of the mapping unit 112 stores six bits. The signals for those stored six bits are defined as $b_0$, $b_1$, $b_2$, $b_3$, $b_4$, and $b_5$. The method of bit storage used by the bit storage unit 91, that is to say, the number of bits stored per unit, can be changed as per a request from an external device (not illustrated).

The bit addition unit 92 performs six-bit exclusive OR operation on the six bit signals $b_0$, $b_1$, $b_2$, $b_3$, $b_4$, and $b_5$ stored in the bit storage unit 91 to generate one bit, thus obtaining a signal $b_6$ for the seventh bit. This corresponds to single parity check coding. The bit addition unit 92 also inverts $b_6$ to obtain a signal $b_7$ for the eighth bit. Also the method of bit addition performed by the bit addition unit 92 can be changed as per a request from an external device. The method of obtaining $b_6$ and $b_7$ each treated as parity may be, for example, to perform exclusive OR operation on a combination other than the above or to perform table processing in which $b_6$ and $b_7$ that correspond to a combination of $b_0$ to $b_5$ (there are 64 patterns) are determined. In the table processing, a table of correspondence between combinations of $b_0$ to $b_5$ and $b_6$ and $b_7$ is prepared beforehand, and $b_6$ and $b_7$ corresponding to values each represented by $b_0$ to $b_5$ (i.e. the combination of $b_0$ to $b_5$) read from the bit storage unit 91 are read from the table of correspondence.

The symbol assignment unit 93 assigns the three bits $b_0$ to $b_2$ to the phase of an X-polarized wave, assigns the three bits $b_3$ to $b_5$ to the phase of a Y-polarized wave, assigns $b_6$ to the amplitude of the X-polarized wave, and assigns $b_7$ to the amplitude of the Y-polarized wave. This process corresponds to mapping illustrated in FIG. 13 for 6b4D-2A8PSK. The content of the mapping performed by the symbol assignment unit 93 can be changed as per an extrinsic request that is not illustrated.

The mapping unit 112 outputs, to the transmitting-end waveform processor 113, a signal formed of four lanes including XI, XQ, YI, and YQ that each have undergone the above assignment.

The transmitting-end waveform processor 113 performs processing including signal spectrum shaping on the mapped four-lane signal input from the mapping unit 112 and outputs the resulting signal formed of the four lanes including XI, XQ, YI, and YQ to the optical-signal generation unit 120.

The digital-to-analog converter 61 of the optical-signal generation unit 120 performs digital-to-analog conversion on the four-lane signal input from the transmitting-end waveform processor 113 of the transmitting-end electrical processing unit 110 and outputs a converted analog signal to the modulator driver 62. In cases where a digital signal input from the transmitting-end waveform processor 113 of the transmitting-end electrical processing unit 110 is formed of, for example, four lanes including an XI lane, an XQ lane, a YI lane, and a YQ lane, the digital-to-analog converter 61 performs digital-to-analog conversion on each of the four lanes. The digital-to-analog converter 61 outputs a four-lane analog signal to the modulator driver 62.

The modulator driver 62 amplifies the analog signal input from the digital-to-analog converter 61 and outputs the amplified analog signal to the polarization multiplexing I/Q optical modulator 64. In cases where an analog signal input from the digital-to-analog converter 61 is formed of, for example, four lanes including an XI lane, an XQ lane, a YI lane, and a YQ lane, the modulator driver 62 performs amplification on each of the four lanes. The modulator driver 62 outputs the amplified four-lane analog signal to the polarization multiplexing I/Q optical modulator 64.

The light source 63 produces unmodulated light having, for example, a wavelength that is based on a C-band International Telecommunication Union-Telecommunication Standardization Sector (ITU-T) grid, namely, a wavelength that is selected from an ITU-T G694.1-compliant C-band ranging between 1530 nm and 1565 nm, inclusive, and outputs the produced unmodulated light to the polarization multiplexing I/Q optical modulator 64.

The polarization multiplexing I/Q optical modulator 64 modulates the unmodulated light input from the light source 63 with the four-lane analog electrical signal input from the modulator driver 62 and outputs it to the optical transmission unit 200.

The optical transmission unit 200 transmits an optical signal input from the polarization multiplexing I/Q optical modulator 64 of the optical-signal generation unit 120 of the optical transmission apparatus 100 and outputs it to the optical receiving apparatus 300. The optical transmission unit 200 may be configured to include, for example, an optical multiplexing and demultiplexing apparatus that is configured to include a wavelength selective switch (WSS), an arrayed waveguide grating (AWG), an interleaver, and an optical coupler, an optical amplifier for loss compensation, and an optical fiber for chromatic dispersion compensation in addition to the optical fiber serving as a transmission line fiber.

The optical receiving apparatus 300 performs reception processing on the optical signal that is input from the optical transmission unit 200 as follows.

In the optical receiving apparatus 300, the light source 65 of the optical-signal detector 310 produces unmodulated light having, for example, a wavelength based on the C-band ITU-T grid, and outputs the produced unmodulated light to the coherent receiver 66. The wavelength of the unmodulated light produced by the light source 65 that serves as a local oscillation light source substantially corresponds with the wavelength of a carrier wave or a sub-carrier wave for the optical signal input from the optical transmission unit 200 to the coherent receiver 66.

The coherent receiver 66 that is a polarization-diversity integrated coherent receiver causes mixed interference between the optical signal input from the optical transmission unit 200 and the unmodulated light input from the light source 65 for detection and conversion into an electrical signal, and then it outputs the electrical signal to the analog-to-digital converter 67. Upon detecting, by means of local oscillation light, which is the unmodulated light input from the light source 65, as a reference, the receive signal in the form of four separated lanes including an I'-axis component of an X'-polarized wave, a Q'-axis component of the X'-polarized wave, an I'-axis component of a Y'-polarized wave, and a Q'-axis component of the Y'-polarized wave, the coherent receiver 66 converts the four-lane optical signal into the electric signal and amplifies the converted electrical signal to achieve, for each of the four lanes, an amplitude required for subsequent-stage processing. It is to be noted that X', Y', I', and Q' each have "'" to show that two orthogonal polarization components and two orthogonal phase components that are obtained from the optical signal received by the optical receiving apparatus 300 do not always correspond with two orthogonal polarization components and two orthogonal phase components of the lanes generated by the optical transmission apparatus 100.

The analog-to-digital converter 67 performs analog-to-digital conversion on the electrical signal input from the coherent receiver 66 and outputs it to the receiving-end electrical processing unit 320. The analog-to-digital converter 67 performs analog-to-digital conversion on each of the four lanes including X'I', X'Q', Y'I', and Y'Q' to convert the electrical signal to a digital signal.

The receiving-end waveform processor 321 of the receiving-end electrical processing unit 320 performs, on the electrical signal input from the analog-to-digital converter 67 of the optical-signal detector 310, compensation for physical differential delay that occurs in the optical-signal generation unit 120 of the optical transmission apparatus 100, the optical transmission unit 200, and the optical-signal detector 310, compensation for waveform distortion including chromatic dispersion and bandwidth narrowing, compensation for polarization mode dispersion, polarization state change, and symbol timing shift, and compensation for optical frequency difference and optical phase difference between the carrier wave or the sub-carrier wave and the local oscillation light to recover the XI, XQ, YI and YQ lanes of the transmit signal, and then the receiving-end waveform processor 321 outputs it to the likelihood generation unit 322. Constellation points of the recovered signal for the X-polarized wave and the Y-polarized wave are 2A8PSK signals.

The likelihood generation unit 322 is the likelihood generation device 50 described in the first embodiment. Based on the signal that is input from the receiving-end waveform processor 321 and is formed of the four lanes including XI, XQ, YI, and YQ, the likelihood generation unit 322 generates six bit likelihood information items and outputs them to the decoding processor 323.

The decoding processor 323 performs soft decision error correction decoding on the likelihood information items input from the likelihood generation unit 322. The error correction decoding involves, for example, storage of several frames of the OTU4 framed signal, use of processing that corresponds to the error correction coding carried out by the code processor 111 of the optical transmission apparatus 100, such as deinterleaving for restoration of original bit arrangement, and decoding according to the rule of the LDPC code. A decoded signal is output to an external device.

Figure 7:
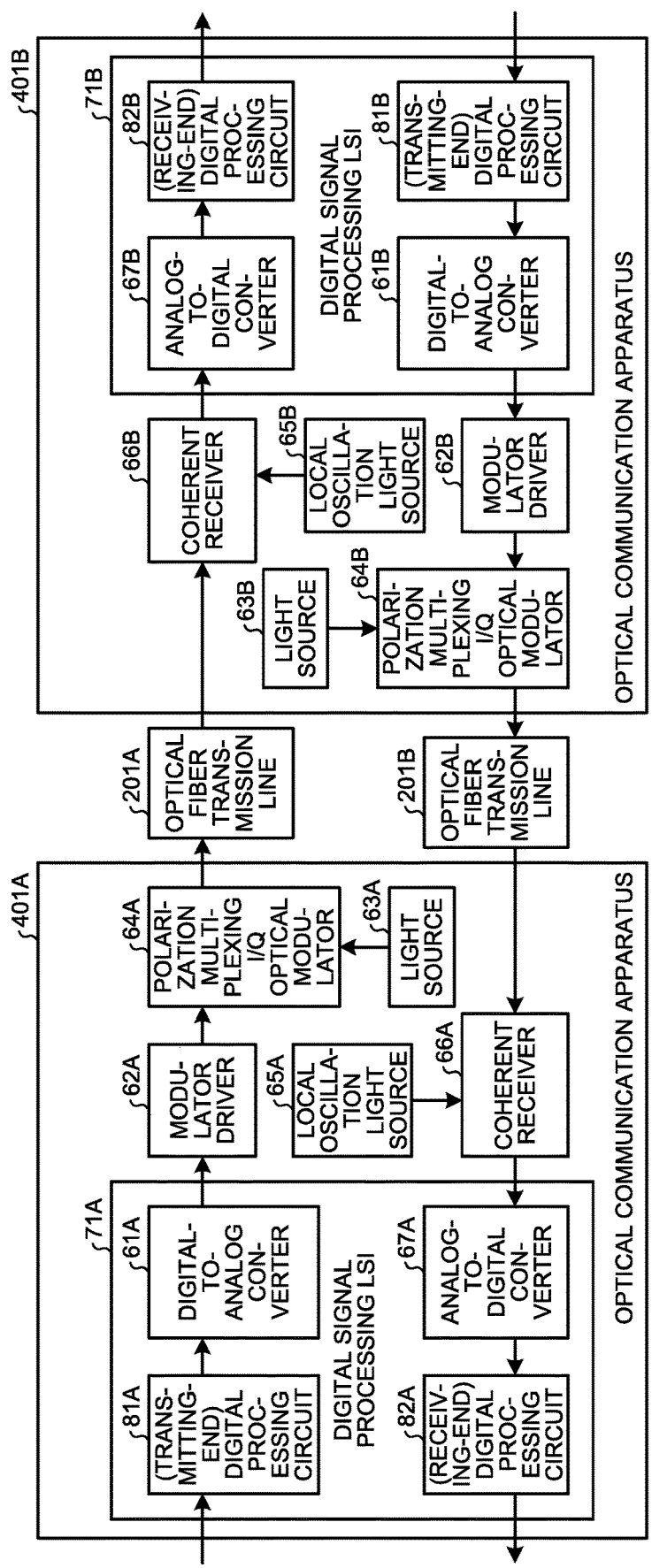
FIG. 7 is a diagram illustrating an example of a hardware configuration that achieves the optical transmission system according to the second embodiment.

FIG. 7 is a diagram illustrating an example of a hardware configuration that achieves the optical transmission system according to the second embodiment. In the hardware example configuration in FIG. 7, the optical transmission system provides two-way communication between an optical communication apparatus 401A and an optical communication apparatus 401B via optical fiber transmission lines 201A and 201B. The optical transmission apparatus 100 illustrated, for example, in FIG. 4 is implemented by use of the optical communication apparatus 401A, while the optical receiving apparatus 300 illustrated, for example, in FIG. 4 is implemented by use of the optical communication apparatus 401B. The optical transmission unit 200 illustrated in FIG. 4 is implemented by use of the optical fiber transmission line 201A. The optical communication apparatus 401B has the same configuration as the optical communication apparatus 401A, so that a description provided here is of the optical communication apparatus 401A.

The optical communication apparatus 401A includes a digital signal processing large scale integration (digital signal processing LSI) 71A, a modulator driver 62A, a light source 63A, a polarization multiplexing I/Q optical modulator 64A, a local oscillation light source 65A, and a coherent receiver 66A. The digital signal processing LSI 71A includes a digital-to-analog converter 61A, an analog-to-digital converter 67A, and digital processing circuits 81A and 82A. When the optical communication apparatus 401A is a transmitting end, the digital processing circuit 81A carries out digital signal processing for the optical communication apparatus 401A to transmit a signal. When the optical communication apparatus 401A is a receiving end, the digital processing circuit 82A carries out digital signal processing for the optical communication apparatus 401A to receive a signal. The digital processing circuits 81A and 82A are logic circuits.

The components of the optical transmission apparatus 100 illustrated in FIG. 5 are implemented by use of the digital processing circuit 81A and the digital-to-analog converter 61A of the digital signal processing LSI 71A, the modulator driver 62A, the light source 63A, and the polarization multiplexing I/Q optical modulator 64A in the optical communication apparatus 401A. Specifically, the transmitting-end electrical processing unit 110 in the optical transmission apparatus 100, i.e., the code processor 111, the mapping unit 112, and the transmitting-end waveform processor 113, is implemented by use of the digital processing circuit 81A of the digital signal processing LSI 71A. The digital-to-analog converter 61 of the optical-signal generation unit 120 of the optical transmission apparatus 100 is implemented by use of the digital-to-analog converter 61A of the digital signal processing LSI 71A. The modulator driver 62, the light source 63, and the polarization multiplexing I/Q optical modulator 64 of the optical transmission apparatus 100 are implemented by use of the modulator driver 62A, the light source 63A, and the polarization multiplexing I/Q optical modulator 64A, respectively.

The components of the optical receiving apparatus 300 illustrated in FIG. 6 are implemented by use of a local oscillation light source 65B, a coherent receiver 66B, and an analog-to-digital converter 67B and a digital processing circuit 82B of a digital signal processing LSI 71B in the optical communication apparatus 401B. Specifically, the receiving-end electrical processing unit 320 in the optical receiving apparatus 300, i.e., the receiving-end waveform processor 321, the likelihood generation unit 322, and the decoding processor 323, is implemented by use of the digital processing circuit 82B of the digital signal processing LSI 71B. The analog-to-digital converter 67B of the digital signal processing LSI 71B constitutes the analog-to-digital converter 67 of the optical receiving apparatus 300. The light source 65 and the coherent receiver 66 of the optical receiving apparatus 300 are implemented by use of the local oscillation light source 65B and the coherent receiver 66B, respectively.

When the optical communication apparatus 401B transmits an optical signal to the optical communication apparatus 401A via the optical fiber transmission line 201B, a digital processing circuit 81B, a digital-to-analog converter 61B, a modulator driver 62B, a light source 63B, and a polarization multiplexing I/Q optical modulator 64B of the optical communication apparatus 401B operate as an optical transmission apparatus. Moreover, the local oscillation light source 65A, the coherent receiver 66A, the analog-to-digital converter 67A, and the digital processing circuit 82A of the optical communication apparatus 401A operate as an optical receiving apparatus.

Figure 8:
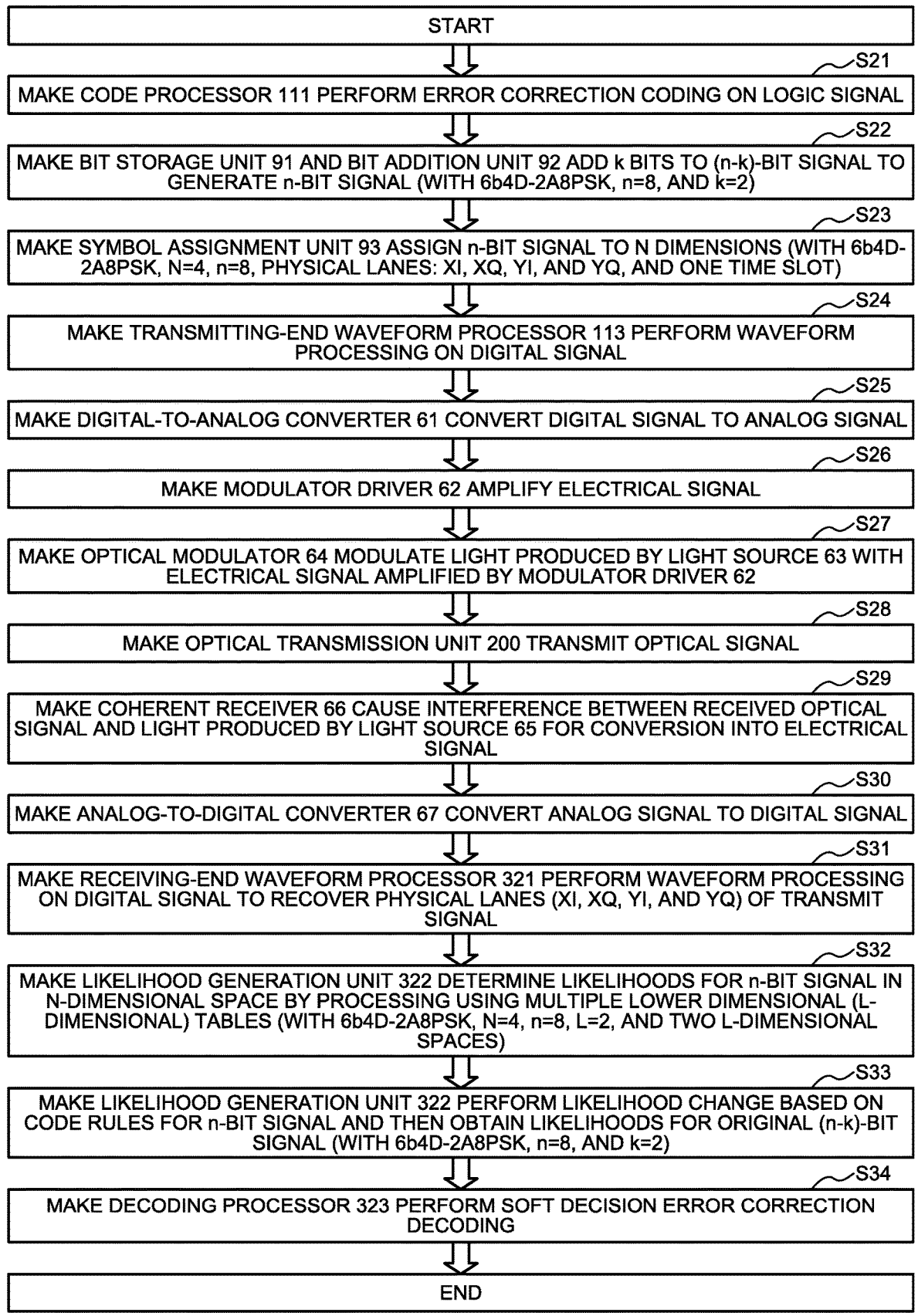
FIG. 8 is a flowchart illustrating an example of an optical signal transmission procedure in the optical transmission system according to the second embodiment.

FIG. 8 is a flowchart illustrating an example of an optical signal transmission procedure in the optical transmission system 1 according to the second embodiment.

In the optical signal transmission procedure for the optical transmission system 1, respective processes of steps S21 to S27 in FIG. 8 are carried out first in the optical transmission apparatus 100 that constitutes the transmitting-end optical communication apparatus to transmit an optical signal, and respective processes of steps S29 to S34 are carried out next in the optical receiving apparatus 300 that constitutes the receiving-end optical communication apparatus to receive the optical signal. A description is hereinafter provided of the process of each of the steps.

In optical signal transmission operation, first, the code processor 111 of the optical transmission apparatus 100 performs error correction coding on a logic signal input from an external device. (step S21).

Next, the bit storage unit 91 and the bit addition unit 92 of the optical transmission apparatus 100 divide, into (n−k)-bit units, a logic signal that has undergone the error correction coding and has been input from the code processor 111 and add k bits to an (n−k)-bit signal to generate an n-bit signal (step S22). In this step S22, the bit storage unit 91 stores, in (n−k)-bit units, the logic signal that has undergone the error correction coding and has been input from the code processor 111, and the bit addition unit 92 reads the (n−k)-bit signal stored in the bit storage unit 91, generates the k parity bits on the basis of the read signal, and adds those k parity bits to the (n−k)-bit signal. In cases where the optical transmission system 1 is an optical transmission system where 6b4D-2A8PSK is applied, the bit addition unit 92 adds two parity bits to a six-bit logic signal. In other words, n=8 and k=2.

Next, the symbol assignment unit 93 of the optical transmission apparatus 100 assigns, to N dimensions, the n-bit signal input from the bit addition unit 92 (step S23). In cases where the optical transmission system 1 is the optical transmission system where 6b4D-2A8PSK is applied, the symbol assignment unit 93 assigns an eight-bit signal to four dimensions. Specifically, the symbol assignment unit 93 assigns three bits of the six-bit logic signal to the phase of an X-polarized wave, assigns the other three bits to the phase of a Y-polarized wave, assigns one of the two parity bits to the amplitude of the X-polarized wave, and assigns the other parity bit to the amplitude of the Y-polarized wave.

Next, the transmitting-end waveform processor 113 of the optical transmission apparatus 100 performs waveform processing including signal spectrum shaping on a digital signal input from the symbol assignment unit 93 (step S24).

Next, the digital-to-analog converter 61 of the optical transmission apparatus 100 converts a digital signal input from the transmitting-end waveform processor 113 to an analog signal (step S25).

Next, the modulator driver 62 of the optical transmission apparatus 100 amplifies the analog electrical signal input from the digital-to-analog converter 61 (step S26).

Next, the polarization multiplexing I/Q optical modulator 64 of the optical transmission apparatus 100 modulates unmodulated light produced by the light source 63 with the electrical signal input from the modulator driver 62 to generate an optical signal for transmission to the optical receiving apparatus 300 (step S27). The polarization multiplexing I/Q optical modulator 64 outputs the generated optical signal to the optical transmission unit 200.

Next, the optical transmission unit 200 transmits the optical signal input from the polarization multiplexing I/Q optical modulator 64 of the optical transmission apparatus 100 to the optical receiving apparatus 300 (step S28).

Next, the coherent receiver 66 of the optical receiving apparatus 300 causes mixed interference between the optical signal received from the optical transmission apparatus 100 via the optical transmission unit 200 and unmodulated light produced by the light source 65 to convert the optical signal into an electrical signal (step S29).

Next, the analog-to-digital converter 67 of the optical receiving apparatus 300 converts the analog signal input from the coherent receiver 66 to a digital signal (step S30).

Next, the receiving-end waveform processor 321 of the optical receiving apparatus 300 performs waveform processing on the digital signal input from the analog-to-digital converter 67 to recover physical lanes XI, XQ, YI, and YQ of the transmit signal (step S31). The waveform processing that the receiving-end waveform processor 321 performs on the digital signal includes compensation for waveform distortion including chromatic dispersion and bandwidth narrowing, and compensation for polarization mode dispersion and polarization state change.

Next, the likelihood generation unit 322 of the optical receiving apparatus 300 determines, by performing table processing using a plurality of L-dimensional tables, likelihoods for the n-bit signal that has been input from the receiving-end waveform processor 321 and has an N-dimensional arrangement, where L is lower than N (step S32). In cases where the optical transmission system 1 is the optical transmission system where 6b4D-2A8PSK is applied, N=4, n=8, L=2, and L-dimensional spaces, that is to say, the two-dimensional tables, are two in number. The process of step S32 is carried out by the temporary likelihood determination units 51a and 51b of the likelihood generation device 50 described in the first embodiment.

Next, based on the code rules for the n-bit signal, the likelihood generation unit 322 of the optical receiving apparatus 300 changes the likelihoods determined in step S32 to obtain likelihoods for the original (n−k)-bit signal (step S33). In cases where the optical transmission system 1 is the optical transmission system where 6b4D-2A8PSK is applied, n=8 and k=2. The process of step S33 is carried out by the likelihood correction unit 52 of the likelihood generation device 50 described in the first embodiment.

Next, the decoding processor 323 of the optical receiving apparatus 300 performs soft decision error correction decoding using the likelihoods for the (n−k)-bit signal that are input from the likelihood generation unit 322 (step S34).

In the optical transmission system 1, the optical signal is transmitted from the optical transmission apparatus 100 to the optical receiving apparatus 300 according to the above-described procedure.

Figure 9:
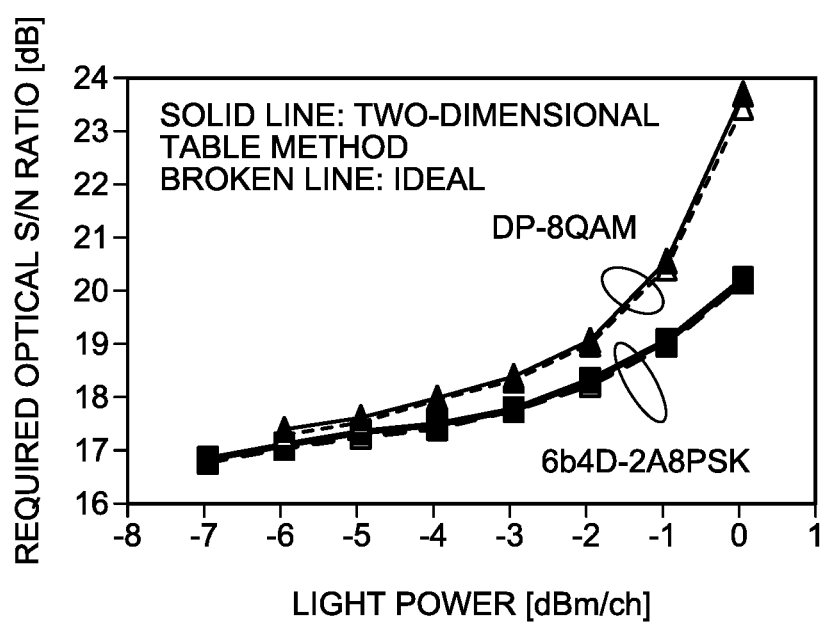
FIG. 9 is a graph illustrating the experimental result of transmission characteristic comparison between DP-8QAM and 6b4D-2A8PSK.

FIG. 9 is a graph illustrating the experimental result of transmission characteristic comparison between DP-8QAM and 6b4D-2A8PSK. FIG. 9 illustrates the result of an experiment in which a 70-wave signal that underwent wavelength multiplexing with a spacing of 50 GHz was transmitted over 1200 km with a baud rate of 32 Gbaud and on condition that chromatic dispersion compensation is periodically carried out in a transmission line. In this experiment, the transmission covered 21 sections with each of the sections being a distance of roughly 70 km. Moreover, an optical amplifier compensated for fiber transmission loss at each of the sections so that light power input at each of the sections changes from −7 dBm to 0 dBm per channel. The optical signal-to-noise ratio required to achieve a generalized and normalized mutual information of 0.92 was measured. In FIG. 9, the characteristics of DP-8QAM and 6b4D-2A8PSK when ideal likelihood generation was carried out ignoring circuit implementation are indicated by broken lines, and the characteristics of DP-8QAM and 6b4D-2A8PSK when likelihood generation was carried out with circuit implementation taken into account are indicated by solid lines. For the likelihood generation that was carried out with the circuit implementation taken into account, a method described in Patent Literature 1 was used for DP-8QAM, and processing performed by the likelihood generation device 50 described in the first embodiment was used for 6b4D-2A8PSK. FIG. 9 shows that DP-8QAM and 6b4D-2A8PSK each have the characteristic comparable to the characteristic obtained when the ideal likelihood generation was carried out. Moreover, 6b4D-2A8PSK can meet a desired characteristic with a smaller optical signal-to-noise ratio compared with DP-8QAM, and this tendency becomes more prominent as the light power increases.

In the present embodiment described, the soft decision error correction is carried out using the LDPC code as an error correction code. However, hard decision error correction that uses, for example, a Reed-Solomon code or a Bose-Chaudhuri-Hocquenghem (BCH) code can also be used. Another possibility is to use soft decision error correction using a turbo code. In cases where the hard decision error correction is applied, the decoding processor 323 only needs to use hard decision information items among likelihood information items output by the likelihood generation unit 322.

As described above, the optical receiving apparatus uses the likelihood generation device described in the first embodiment to obtain the likelihoods for the receive signal in the optical transmission system according to the present embodiment and thus can have a reduced size.

Third Embodiment

Figure 10:
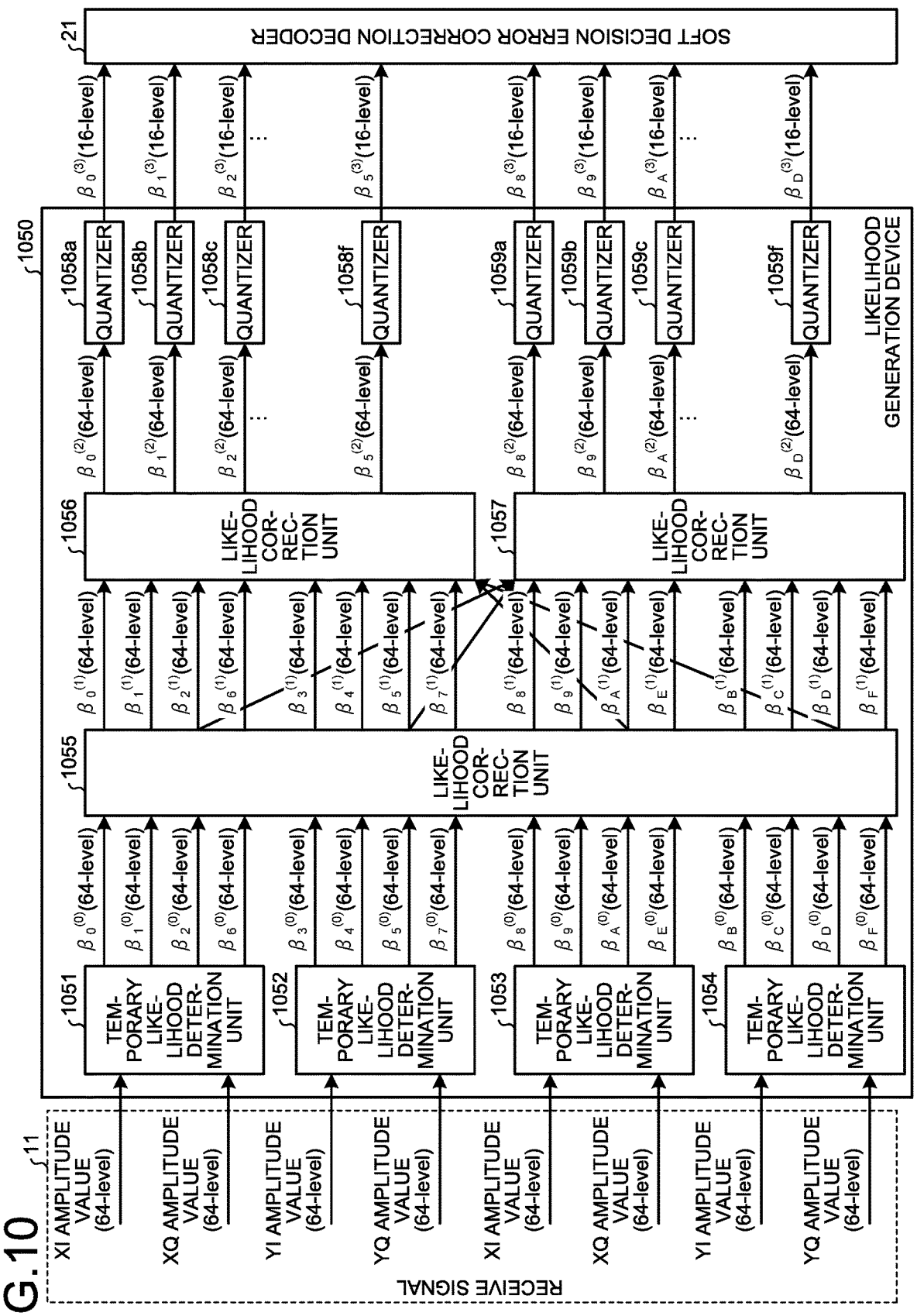
FIG. 10 is a diagram illustrating an example configuration of a likelihood generation device according to a third embodiment of the present invention.

FIG. 10 is a diagram illustrating an example configuration of a likelihood generation device according to a third embodiment of the present invention. In the present embodiment, a 12b8D-2A8PSK signal that achieves six bits per symbol is given as an example but a signal format to which the present invention is applicable is not limited thereto. 12b8D-2A8PSK is 8D-2APSK that allows communication of 12 bits in one block and that one block includes two time slots. In other words, the 12b8D-2A8PSK signal is a signal including, as one block, eight dimensions formed by two orthogonal polarizations, two orthogonal phases, and two time slots.

A likelihood generation device 1050 according to the third embodiment receives, as an input, a receive signal 11. The receive signal 11 consists of XI components, XQ components, YI components, and YQ components for two time slots, and each of the components is represented by 64 gradations. The likelihood generation device 1050 generates likelihood information items on 12 information bits included in the input receive signal 11 and outputs those 12 likelihood information items generated to a soft decision error correction decoder 21. In the example in FIG. 10, the likelihood generation device 1050 outputs 16-value or 16-level likelihood information items. The receive signal 11 is a signal that is obtained as a result of coherent detection of an optical signal transmitted from an optical transmission apparatus, which is a counter apparatus, and digital signal processing of an electrical signal obtained by the coherent detection for waveform compensation and signal recovery. The coherent detection of the optical signal and the digital signal processing of the electrical signal obtained by the coherent detection are carried out following a publicly known method described, for example, in Non-Patent Literature 1 or Non-Patent Literature 2. The soft decision error correction decoder 21 carries out error correction decoding following a publicly known method to recover the 12 information bits.

As illustrated in FIG. 10, the likelihood generation device 1050 includes temporary likelihood determination units 1051 to 1054, a likelihood correction unit 1055 as a first likelihood correction unit, likelihood correction units 1056 and 1057 that serve as a second likelihood correction unit, six quantizers 1058a to 1058f that each quantize likelihoods output from the likelihood correction unit 1056, and six quantizers 1059a to 1059f that each quantize likelihoods output from the likelihood correction unit 1057. The temporary likelihood determination units 1051 to 1054 constitute a likelihood derivation unit.

Among the signal components included the receive signal 11, the signal components transmitted in the first time slot are input to the temporary likelihood determination units 1051 and 1052. Specifically, among the signal components transmitted in the first time slot, an XI amplitude value and an XQ amplitude value are input as the signal components of an X-polarized wave to the temporary likelihood determination unit 1051, and a YI amplitude value and a YQ amplitude value are input as the signal components of a Y-polarized wave to the temporary likelihood determination unit 1052. Among the signal components included in the receive signal 11, the signal components transmitted in the second time slot are input to the temporary likelihood determination units 1053 and 1054. Specifically, among the signal components transmitted in the second time slot, an XI amplitude value and an XQ amplitude value are input as the signal components of an X-polarized wave to the temporary likelihood determination unit 1053, and a YI amplitude value and a YQ amplitude value are input as the signal components of a Y-polarized wave to the temporary likelihood determination unit 1054.

The temporary likelihood determination unit 1051 outputs, to the likelihood correction unit 1055, bit likelihood information items that are predetermined to correspond to each of 4096 addresses represented in a two-dimensional space by XI amplitude values and XQ amplitude values in the first time slot that may be input. The temporary likelihood determination unit 1051 stores a table that stores the likelihoods $\beta_0^{(0)}$, $\beta_1^{(0)}$, $\beta_2^{(0)}$, and $\beta_6^{(0)}$ that respectively correspond to bits $b_0$, $b_1$, $b_2$, and $b_6$ (illustrated in FIG. 13) for an X-polarized wave. In other words, the temporary likelihood determination unit 1051 stores the table of correspondence between each of those 4096 addresses represented by the XI and XQ amplitude values and the likelihoods $\beta_0^{(0)}$, $\beta_1^{(0)}$, $\beta_2^{(0)}$, and $\beta_6^{(0)}$ and outputs, to the likelihood correction unit 1055, likelihoods $\beta_0^{(0)}$, $\beta_1^{(0)}$, $\beta_2^{(0)}$, and $\beta_6^{(0)}$ corresponding to the address represented by the input XI and XQ amplitude values. In the example in FIG. 10, each of those likelihoods is represented by 64 gradations.

The temporary likelihood determination unit 1052 outputs, to the likelihood correction unit 1055, bit likelihood information items that are predetermined to correspond to each of 4096 addresses represented in a two-dimensional space by YI amplitude values and YQ amplitude values in the first time slot that may be input. The temporary likelihood determination unit 1052 stores a table that stores the likelihoods $\beta_3^{(0)}$, $\beta_4^{(0)}$, $\beta_5^{(0)}$, and $\beta_7^{(0)}$ that respectively correspond to bits $b_3$, $b_4$, $b_5$, and $b_7$ (illustrated in FIG. 13) for a Y-polarized wave. In other words, the temporary likelihood determination unit 1052 stores the table of correspondence between each of those 4096 addresses represented by the YI and YQ amplitude values and the likelihoods $\beta_3^{(0)}$, $\beta_4^{(0)}$, $\beta_5^{(0)}$, and $\beta_7^{(0)}$ and outputs, to the likelihood correction unit 1055, likelihoods $\beta_3^{(0)}$, $\beta_4^{(0)}$, $\beta_5^{(0)}$, and $\beta_7^{(0)}$ corresponding to the address represented by the input YI and YQ amplitude values. In the example in FIG. 10, each of those likelihoods is represented by 64 gradations.

The temporary likelihood determination unit 1053 outputs, to the likelihood correction unit 1055, bit likelihood information items that are predetermined to correspond to each of 4096 addresses represented in a two-dimensional space by XI amplitude values and XQ amplitude values in the second time slot that may be input. In cases where bits $b_8$, $b_9$, $b_A$, and $b_E$ are bits for the X-polarized wave in the second time slot and are similar to the bits $b_0$, $b_1$, $b_2$, and $b_6$ illustrated in FIG. 13, the temporary likelihood determination unit 1053 stores a table that stores the likelihoods $\beta_8^{(0)}$, $\beta_9^{(0)}$, $\beta_A^{(0)}$, and $\beta_E^{(0)}$ that that respectively correspond to the bits $b_8$, $b_9$, $b_A$, and $b_E$ for the X-polarized wave. In other words, the temporary likelihood determination unit 1053 stores the table of correspondence between each of those 4096 addresses represented by the XI and XQ amplitude values and the likelihoods $\beta_8^{(0)}$, $\beta_9^{(0)}$, $\beta_A^{(0)}$, and $\beta_E^{(0)}$ and outputs, to the likelihood correction unit 1055, likelihoods $\beta_8^{(0)}$, $\beta_9^{(0)}$, $\beta_A^{(0)}$, and $\beta_E^{(0)}$ corresponding to the address represented by the input XI and XQ amplitude values. In the example in FIG. 10, each of those likelihoods is represented by 64 gradations.

The temporary likelihood determination unit 1054 outputs, to the likelihood correction unit 1055, bit likelihood information items that are predetermined to correspond to each of 4096 addresses represented in a two-dimensional space by YI amplitude values and YQ amplitude values in the second time slot that may be input. In cases where bits $b_B$, $b_C$, $b_D$, and $b_F$ are bits for the Y-polarized wave in the second time slot and are similar to the bits $b_3$, $b_4$, $b_5$, and $b_7$ illustrated in FIG. 13, the temporary likelihood determination unit 1054 stores a table that stores the likelihoods $\beta_B^{(0)}$, $\beta_C^{(0)}$, $\beta_D^{(0)}$, and $\beta_F^{(0)}$ and outputs, to the and $b_F$ for the Y-polarized wave. In other words, the temporary likelihood determination unit 1054 stores the table of correspondence between each of those 4096 addresses represented by the YI and YQ amplitude values and the likelihoods $\beta_B^{(0)}$, $\beta_C^{(0)}$, $\beta_D^{(0)}$, and $\beta_F^{(0)}$ and outputs, to the likelihood correction unit 1055, likelihoods $\beta_B^{(0)}$, $\beta_C^{(0)}$, $\beta_D^{(0)}$, and $\beta_F^{(0)}$ corresponding to the address represented by the input YI and YQ amplitude values. In the example in FIG. 10, each of those likelihoods is represented by 64 gradations.

To determine likelihood information items on the original 12 bits ($b_0$ to $b_5$, $b_8$, $b_9$, and $b_A$ to $b_D$), the likelihood correction unit 1055 performs likelihood change on the 16 bit likelihood information items $\beta_i^{(0)}$ (i=0 to 9, A to F) input from the temporary likelihood determination units 1051, 1052, 1053, and 1054 on the basis of the rules for generation of four parity bits $b_6$, $b_7$, $b_E$, and $b_F$, namely, "$b_6=b_F=\text{XOR}(b_2,b_5,b_4,b_D)$" and "$b_7=b_E=\text{NOT}(b_6)=\text{XOR}(b_2,b_5,b_4,b_D,1)$". The likelihood correction unit 1055 outputs, to the likelihood correction unit 1056, likelihood information items on the bits $b_0$ to $b_7$ among the determined likelihood information items and outputs likelihood information items on the other bits to the likelihood correction unit 1057. The bit precision of, for example, 64 gradations is achieved here. It is to be noted that the bit precision may be increased to, for example, 256 gradations or 512 gradations according to circuit resources.

The likelihood correction unit 1055 performs the likelihood change on the input 16 bit likelihood information items using, for example, a publicly known min-sum method. Specifically, the likelihood correction unit 1055 performs the likelihood change on the 16 bit likelihood information items by extending, to eight dimensions, the above-described Formulas (1) to (3) that show likelihood change for six information bits ($b_o$ to $b_5$), two parity bits ($b_6$ and $b_7$), and four-dimensional modulation with $b_6=\text{XOR}(b_0,b_1,b_2,b_3,b_4,b_5)$ and with $b_7=\text{NOT}(b_6)=\text{XOR}(b_0,b_1,b_2,b_3,b_4,b_5,1)$. The likelihood correction unit 1055 outputs, to the likelihood correction unit 1056, $\beta_i^{(1)}$(i=0 to 7, A, D) among the likelihood information items obtained by the likelihood change and outputs $\beta_i^{(1)}$(i=8, 9, A to F, 2, 5) to the likelihood correction unit 1057.

Using, for example, the publicly known min-sum method, the likelihood correction unit 1056 performs likelihood change on the eight likelihood information items $\beta_i^{(1)}$ (i=0 to 7) among the likelihood information items input from the likelihood correction unit 1055. Specifically, the likelihood correction unit 1056 performs the likelihood change on the bits on the basis of the two parity generation rules, namely, "$b_6=\text{XOR}(b_2,b_5,b_4,b_D)$" and "$b_7=\text{NOT}(b_6)=\text{XOR}(b_2,b_5,b_4,b_D,1)$", to determine six bit likelihood information items $\beta_i^{(2)}$ (i=0 to 5). The likelihood change performed by the likelihood correction unit 1056 is similar to the likelihood change performed by the likelihood correction unit 52 that is described in the first embodiment. The likelihood correction unit 1056 outputs the determined likelihood information items to the quantizers 1058a to 1058f.

Using, for example, the publicly known min-sum method, the likelihood correction unit 1057 performs likelihood change on the eight likelihood information items $\beta_i^{(1)}$(i=8, 9, A to F) among the likelihood information items input from the likelihood correction unit 1055. Specifically, the likelihood correction unit 1057 performs the likelihood change on the bits on the basis of the two parity generation rules, namely, "$b_F=\text{XOR}(b_2,b_5,b_4,b_D)$" and "$b_E=\text{NOT}(b_F)=\text{XOR}(b_2,b_5,b_4,b_D,1)$", to determine six bit likelihood information items $\beta_i^{(2)}$(i=8, 9, A to D). The likelihood change performed by the likelihood correction unit 1057 is similar to the likelihood change performed by the likelihood correction unit 52 that is described in the first embodiment. The likelihood correction unit 1057 outputs the determined likelihood information items to the quantizers 1059a to 1059f.

The quantizers 1058a to 1058f and the quantizers 1059a to 1059f quantize the 12 bit likelihood information items $\beta_i^{(2)}$(i=0 to 9, A to D, 64 gradations each, for example) input from the likelihood correction units 1056 and 1057 to perform conversion to, for example, 16-gradation likelihood information items. The quantizers 1058a to 1058f and the quantizers 1059a to 1059f output, to the soft decision error correction decoder 21, the likelihood information items $\beta_i^{(3)}$ (i=0 to 9, A to D) that are obtained by the quantization and have their bit resolutions changed. For scaling during quantization, mutual information between $\beta_i^{(2)}$ and $\beta_i^{(3)}$ or the bit error rate obtained after soft decision error correction is used as an index. In cases where the mutual information is used as an index, the parameters are selected to maximize the mutual information. In cases where the bit error rate is used as an index, the parameters are selected to minimize the bit error rate.

Figure 11:
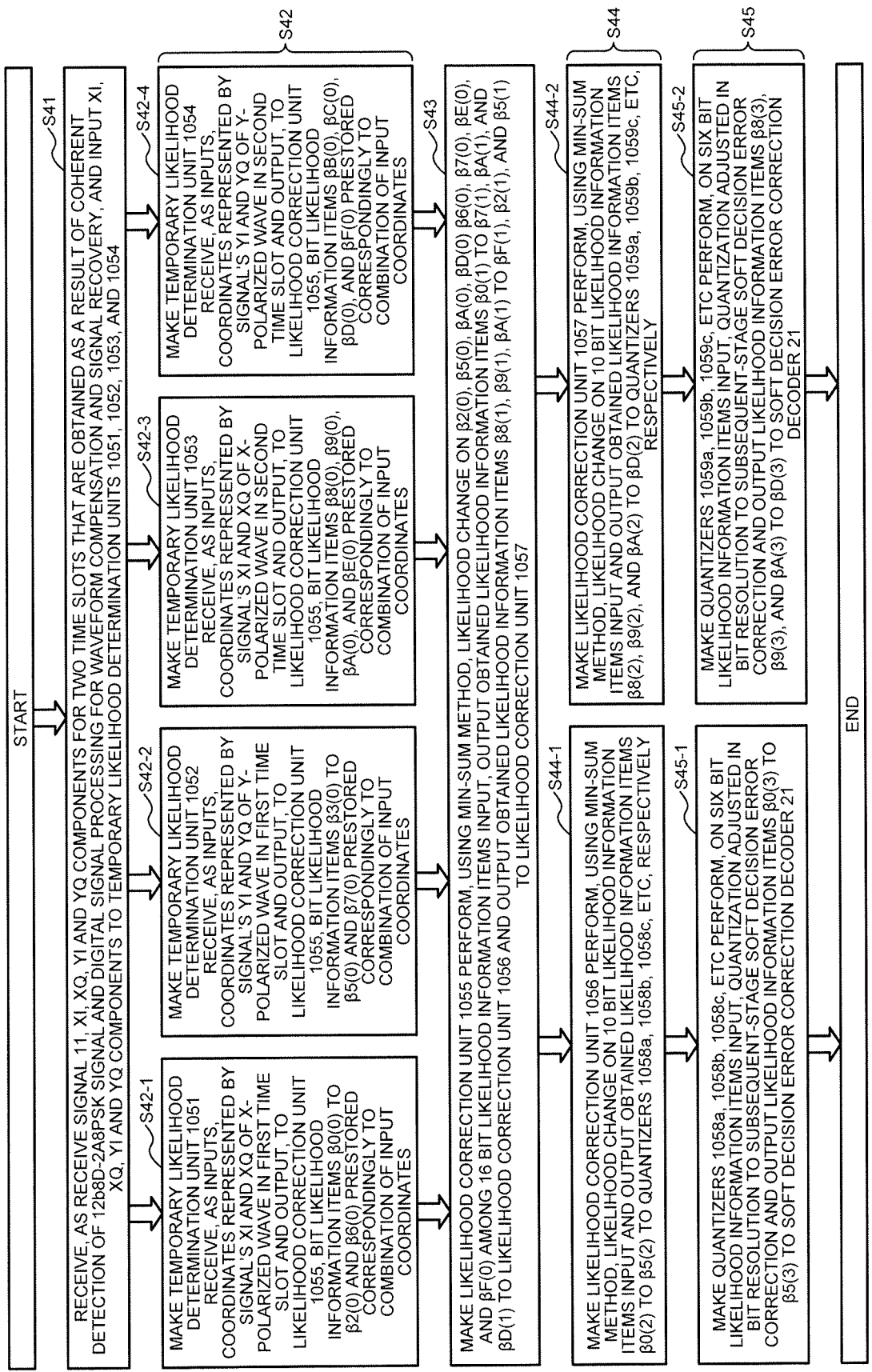
FIG. 11 is a flowchart illustrating an example of a processing procedure in the likelihood generation device according to the third embodiment.

FIG. 11 is a flowchart illustrating an example of a processing procedure in the likelihood generation device 1050 according to the third embodiment.

First, the likelihood generation device 1050 receives XI components, XQ components, YI components, and YQ components for two time slots as a receive signal 11. The XI components, the XQ components, the YI components, and the YQ components for the two time slots are components of the signal that is obtained as a result of coherent detection of a 12b4D-2A8PSK signal by means of, for example, a preceding-stage coherent receiver (omitted from FIG. 10) and digital signal processing for waveform compensation and signal recovery. Among the signal components received by the likelihood generation device 1050, the XI component and the XQ component transmitted in the first time slot, which is one of the two time slots, are input to the temporary likelihood determination unit 1051, and the YI component and the YQ component transmitted in the first time slot are input to the temporary likelihood determination unit 1052. The XI component and the XQ component transmitted in the second time slot, which is the other of the two time slots, are input to the temporary likelihood determination unit 1053, and the YI component and the YQ component transmitted in the second time slot are input to the temporary likelihood determination unit 1054 (step S41).

Next, the temporary likelihood determination units 1051 to 1054 determine, by referring to the tables, likelihoods corresponding to addresses represented by the values of the input receive signal 11, that is to say, constellation points, and output the likelihoods to the likelihood correction unit 1055 (step S42). In other words, the temporary likelihood determination unit 1051 determines the likelihoods corresponding to the address represented by the XI component and the XQ component of the first time slot by referring to the table and outputs the likelihoods $\beta_0^{(0)}$ to $\beta_2^{(0)}$ and $\beta_6^{(0)}$ to the likelihood correction unit 1055 (step S42-1). The temporary likelihood determination unit 1052 determines the likelihoods corresponding to the address represented by the YI component and the YQ component of the first time slot by referring to the table and outputs the likelihoods $\beta_3^{(0)}$ to $\beta_5^{(0)}$ and $\beta_7^{(0)}$ to the likelihood correction unit 1055 (step S42-2). The temporary likelihood determination unit 1053 determines the likelihoods corresponding to the address represented by the XI component and the XQ component of the second time slot by referring to the table and outputs the likelihoods $\beta_8^{(0)}$, $\beta_9^{(0)}$ $\beta_A^{(0)}$ and $\beta_E^{(0)}$ to the likelihood correction unit 1055 (step S42-3). The temporary likelihood determination unit 1054 determines the likelihoods corresponding to the address represented by the YI component and the YQ component of the second time slot by referring to the table and outputs the likelihoods $\beta_B^{(0)}$, $\beta_C^{(0)}$, $\beta_D^{(0)}$, and $\beta_E^{(0)}$ to the likelihood correction unit 1055 (step S42-4).

Next, using the min-sum method, the likelihood correction unit 1055 performs likelihood change on $\beta_2^{(0)}$, $\beta_5^{(0)}$, $\beta_A^{(0)}$, $\beta_D^{(0)}$, $\beta_6^{(0)}$, $\beta_7^{(0)}$, $\beta_E^{(0)}$, and $\beta_F^{(0)}$ among the 16 bit likelihood information items input to determine likelihood information items $\beta_0^{(1)}$ to $\beta_9^{(1)}$ and $\beta_A^{(1)}$ to $\beta_F^{(1)}$. The likelihood correction unit 1055 outputs, to the likelihood correction unit 1056, $\beta_0^{(1)}$ to $\beta_7^{(1)}$, $\beta_A^{(1)}$, and $\beta_D^{(1)}$ among the likelihood information items obtained by the likelihood change and outputs $\beta_8^{(1)}$, $\beta_9^{(1)}$, $\beta_A^{(1)}$ to $\beta_F^{(1)}$, $\beta_2^{(1)}$, and $\beta_5^{(1)}$ to the likelihood correction unit 1057 (step S43).

Next, using the min-sum method, the likelihood correction units 1056 and 1057 perform likelihood change on the likelihood information items input from the likelihood correction unit 1055 to determine likelihood information items $\beta_0^{(2)}$ to $\beta_5^{(2)}$, $\beta_8^{(2)}$, $\beta_9^{(2)}$, and $\beta_A^{(2)}$ to $\beta_D^{(2)}$ (step S44). In other words, using, for example, the min-sum method, the likelihood correction unit 1056 performs the likelihood change on the eight likelihood information items $\beta_i^{(1)}$ (i=0 to 7) among the likelihood information items input from the likelihood correction unit 1055 to determine the likelihood information items $\beta_0^{(2)}$ to $\beta_5^{(2)}$. The likelihood correction unit 1056 outputs the determined likelihood information items $\beta_0^{(2)}$ to $\beta_5^{(2)}$ to the quantizers 1058a to 1058f (step S44-1). Using, for example, the min-sum method, the likelihood correction unit 1057 performs the likelihood change on the eight likelihood information items $\beta_i^{(1)}$ (i=8, 9, A to F) among the likelihood information items input from the likelihood correction unit 1055 to determine the likelihood information items $\beta_8^{(2)}$, $\beta_9^{(2)}$, and $\beta_A^{(2)}$ to $\beta_D^{(2)}$. The likelihood correction unit 1057 outputs the determined likelihood information items $\beta_8^{(2)}$, $\beta_9^{(2)}$, and $\beta_A^{(2)}$ to $\beta_D^{(2)}$ to the quantizers 1059a to 1059f (step S44-2).

Next, the quantizers 1058a to 1058f quantize the likelihoods $\beta_0^{(2)}$ to $\beta_5^{(2)}$ input from the likelihood correction unit 1056 to change bit resolutions, and generate and output likelihoods $\beta_0^{(3)}$ to $\beta_5^{(3)}$ having bit resolutions adjusted to bit resolution in the subsequent-stage soft decision error correction decoder 21 (step S45-1). In a similar manner, the quantizers 1059a to 1059f *quantize the likelihoods* $\beta_8^{(2)}$, $\beta_9^{(2)}$, and $\beta_A^{(2)}$ to $\beta_D^{(2)}$ input from the likelihood correction unit 1057, and generate and output likelihoods $\beta_8^{(3)}$, $\beta_9^{(3)}$, and $\beta_A^{(3)}$ to $\beta_D^{(3)}$ having bit resolutions adjusted to the bit resolution in the subsequent-stage soft decision error correction decoder 21 (step S45-2).

As described above, the likelihood generation device 1050 according to the present embodiment divides the receive signal that has undergone eight-dimensional modulation into the time-slot-based and polarization-based components and determines the likelihood of each of the received bits by referring to the two-dimensional table for each of the components. The receive signal includes the information bits and the parity bits. Based on the parity-bit likelihoods and the parity bit generation rules, the likelihood generation device 1050 corrects the information-bit likelihoods obtained by reference to the tables. The likelihood generation device 1050 also quantizes the corrected information-bit likelihoods, adjusts the likelihoods' resolutions to correspond to the bit resolution in the subsequent-stage soft decision error correction decoder 21, and then outputs the likelihood information items. In this way, the tables of reduced sizes can be achieved for use in likelihood determination, and a circuit can be prevented from being increased in scale. Moreover, computation required for likelihood determination can be prevented from increasing.

While the 12b-2A8PSK signal has been given as an example in the present embodiment described, the present embodiment is also applicable to other signal constellations or codings as well as to a spectral efficiency other than six bits per symbol.

A code-modulated signal that undergoes likelihood generation can be generalized as follows. For determination of k parity bits from (n−k) information bits, an operation part that performs coding selects, from the (n−k) information bits, information bits that number any number between 0 and (n–k), inclusive and performs exclusive OR operation on the selected information bits to determine parity bits and/or performs bit inversion on the result of the exclusive OR operation to determine parity bits. In this case, a likelihood generation device determines a likelihood of each of the bits by reference to a table and then updates the likelihoods of the (n–k) information bits using the likelihoods of the k parity bits and k extrinsic information items defined based on the min-sum method.

In the example configuration in FIG. 10, every one of the bits passes through the temporary likelihood determination unit 1051, 1052, 1053, or 1054, the likelihood correction unit 1055, and the likelihood correction unit 1056 or 1057; however, a detour path not passing through one or more of these circuits can be provided for bit assignment.

In the example described in the present embodiment, the temporary likelihood determination units are four in number, meaning that the four tables each including the two-dimensional address space are used for determination of respective likelihoods of bits transmitted by a signal that has undergone eight-dimensional modulation. However, two tables each including a four-dimensional address space may be used for likelihood determination.

Fourth Embodiment

A description is provided next of an embodiment of an optical transmission system that is achieved using the likelihood generation device described in a third embodiment. The configuration of the optical transmission system according to a fourth embodiment is similar to the configuration of the optical transmission system according to the second embodiment illustrated in FIGS. 4 to 7. Therefore, the fourth embodiment is described with reference to FIGS. 4 to 7. It is to be noted that configurations and operations that are common to the second embodiment and the fourth embodiment are not described.

In the optical transmission apparatus 100 according to the fourth embodiment, the code processor 111 of the transmitting-end electrical processing unit 110 operates similarly to that of the second embodiment.

In the optical transmission apparatus 100 according to the fourth embodiment, the mapping unit 112 of the transmitting-end electrical processing unit 110 works on a logic signal that has undergone error correction coding in 12-bit units to carry out mapping. Specifically, the bit storage unit 91 of the mapping unit 112 stores 12 bits. The method of bit storage used by the bit storage unit 91 can be changed as per an extrinsic request.

The bit addition unit 92 performs exclusive OR operation on $b_2$, $b_5$, $b_A$, and $b_D$ among the 12 bits ($b_0$ to $b_5$, $b_8$, $b_9$, and $b_A$ to $b_D$) stored in the bit storage unit 91 to generate $b_6$ and $b_F$ and also performs bit inversion on $b_6$ and $b_F$ to generate $b_7$ and $b_E$. This corresponds to single parity check coding. The bit addition unit 92 also inverts $b_6$ to obtain the signal $b_7$ for the eighth bit. The method of bit addition performed by the bit addition unit 92 can be changed as per an extrinsic request that is not illustrated. The method of obtaining $b_6$ and $b_7$ each treated as parity may be, for example, to perform exclusive OR operation on a combination other than the above or to perform table processing in which $b_6$ and $b_7$ that correspond to a combination of $b_0$ to $b_5$ (there are 64 patterns) are determined.

The symbol assignment unit 93 assigns the three bits $b_0$ to $b_2$ to the phase of an X-polarized wave of the first time slot, assigns the three bits $b_3$ to $b_5$ to the phase of a Y-polarized wave of the first time slot, assigns $b_6$ to the amplitude of the X-polarized wave of the first time slot, and assigns $b_7$ to the amplitude of the Y-polarized wave of the first time slot. Moreover, the symbol assignment unit 93 assigns the three bits $b_8$, $b_9$, and $b_A$ to the phase of an X-polarized wave of the second time slot, assigns the three bits $b_B$, $b_C$, and $b_D$ to the phase of a Y-polarized wave of the second time slot, assigns $b_E$ to the amplitude of the X-polarized wave of the second time slot, and assigns $b_F$ to the amplitude of the Y-polarized wave of the second time slot. The content of the mapping performed by the symbol assignment unit 93 can be changed as per an extrinsic request that is not illustrated.

The mapping unit 112 outputs, to the transmitting-end waveform processor 113, signals each formed of four lanes including XI, XQ, YI, and YQ that each have undergone the above assignment.

The transmitting-end waveform processor 113 and the optical-signal generation unit 120 operate similarly to those of the second embodiment.

The optical-signal detector 310 of the optical receiving apparatus 300 according to the fourth embodiment operates similarly to that of the second embodiment. In the receiving-end electrical processing unit 320 of the optical receiving apparatus 300 according to the fourth embodiment, the receiving-end waveform processor 321 and the decoding processor 323 operate similarly to those of the second embodiment.

In the receiving-end electrical processing unit 320 of the optical receiving apparatus 300 according to the fourth embodiment, the likelihood generation unit 322 is the likelihood generation device 1050 described in the third embodiment. Based on the four-lane signals that are input from the receiving-end waveform processor 321 and include XI, XQ, YI, and YQ for the two time slots, the likelihood generation unit 322 generates and outputs likelihood information items on the 12 bits to the decoding processor 323.

Figure 12:
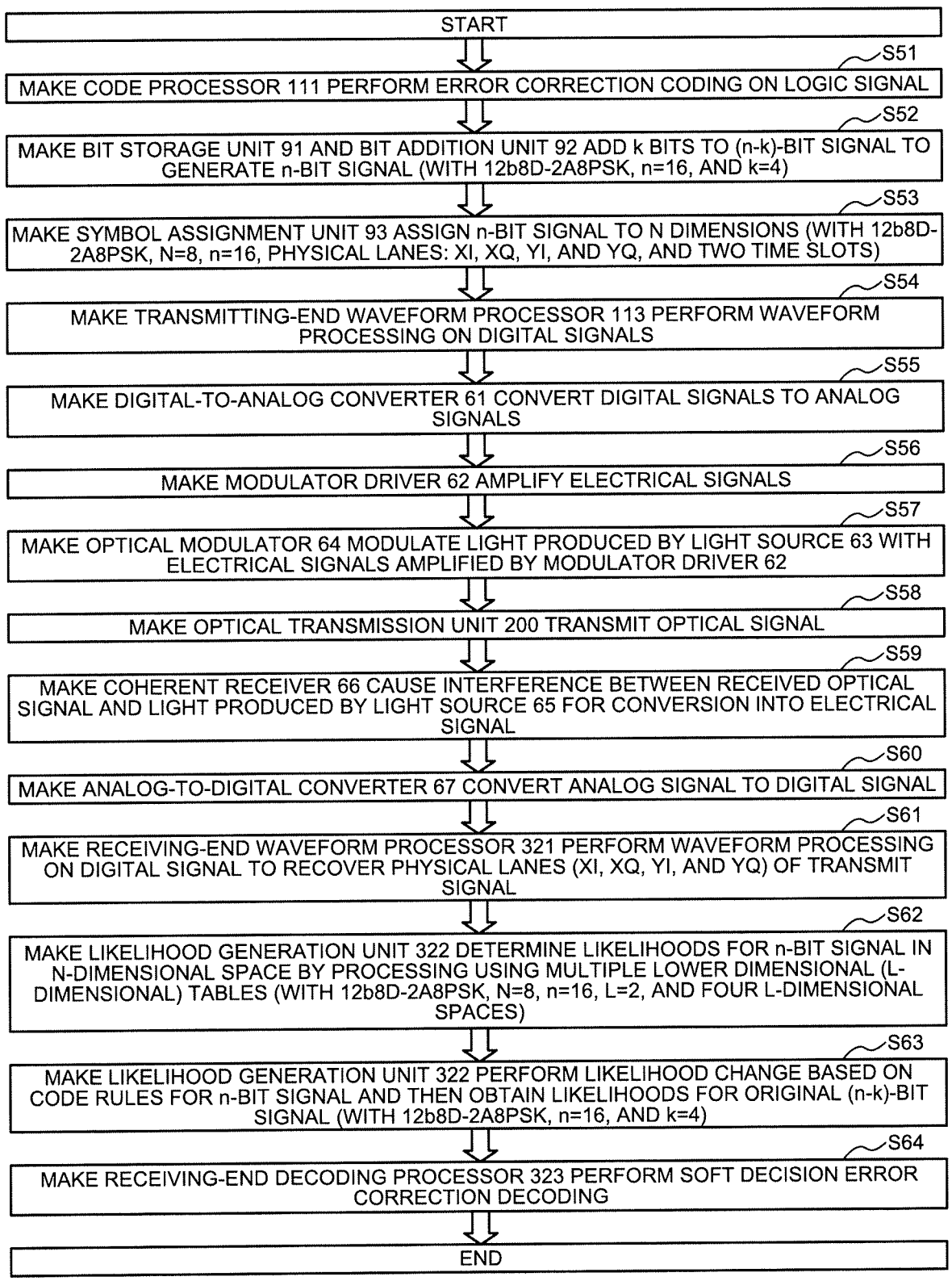
FIG. 12 is a flowchart illustrating an example of an optical signal transmission procedure in an optical transmission system according to a fourth embodiment.

FIG. 12 is a flowchart illustrating an example of an optical signal transmission procedure in the optical transmission system 1 according to the fourth embodiment.

In the optical signal transmission procedure for the optical transmission system 1 according to the fourth embodiment, respective processes of steps S51 to S57 in FIG. 12 are carried out first in the optical transmission apparatus 100 of a transmitting-end optical communication apparatus to transmit an optical signal, and respective processes of steps S59 to S64 are carried out next in the optical receiving apparatus 300 of a receiving-end optical communication apparatus to receive the optical signal. A description is hereinafter provided of the process of each of the steps.

In optical signal transmission operation, first, the code processor 111 of the optical transmission apparatus 100 performs error correction coding on a logic signal input from an external device (step S51). This process is the same as step S21 illustrated in FIG. 8.

Next, the bit storage unit 91 and the bit addition unit 92 of the optical transmission apparatus 100 divide, into (n–k)-bit units, a logic signal that has undergone the error correction coding and has been input from the code processor 111 and add k bits to an (n–k)-bit signal to generate an n-bit signal (step S52). In this step S52, the bit storage unit 91 stores, in (n–k)-bit units, the logic signal that has undergone the error correction coding and has been input from the code processor 111, and the bit addition unit 92 reads the (n–k)-bit signal stored in the bit storage unit 91, generates the k parity bits on the basis of the read signal, and adds those k parity bits to the (n–k)-bit signal. In cases where the optical transmission system 1 is an optical transmission system where 12b8D-2A8PSK is applied, the bit addition unit 92 adds four parity bits to a 12-bit logic signal. In other words, n=16 and k=4.

Next, the symbol assignment unit 93 of the optical transmission apparatus 100 assigns, to N dimensions, the n-bit signal input from the bit addition unit 92 (step S53). In cases where the optical transmission system 1 is the optical transmission system where 12b8D-2A8PSK is applied, the symbol assignment unit 93 assigns a 16-bit signal to eight dimensions. Specifically, the symbol assignment unit 93 assigns three bits selected from the 12-bit logic signal to the phase of an X-polarized wave of the first time slot, assigns three bits selected from those nine remaining bits to the phase of a Y-polarized wave of the first time slot, assigns three bits selected from those six remaining bits to the phase of an X-polarized wave of the second time slot, and assigns those three remaining bits to the phase of a Y-polarized wave of the second time slot. The symbol assignment unit 93 also assigns one bit selected from the four parity bits to the amplitude of the X-polarized wave of the first time slot, assigns one bit selected from those three remaining parity bits to the amplitude of the Y-polarized wave of the first time slot, assigns one bit selected from those two remaining parity bits to the amplitude of the X-polarized wave of the second time slot, and assigns the other parity bit to the amplitude of the Y-polarized wave of the second time slot.

The respective processes of steps S54 to S61 illustrated in FIG. 12 are the same as steps S24 to S31 illustrated in FIG. 8.

When recovery of physical lanes of a transmit signal ends in step S61, the likelihood generation unit 322 of the optical receiving apparatus 300 subsequently determines, by performing table processing using a plurality of L-dimensional tables, likelihoods for the n-bit signal that has been input from the receiving-end waveform processor 321 and has an N-dimensional arrangement, where L is lower than N (step S62). In cases where the optical transmission system 1 is the optical transmission system where 12b8D-2A8PSK is applied, N=8, n=16, L=2, and L-dimensional spaces, that is to say, the two-dimensional tables, are four in number. The process of step S62 is carried out by the temporary likelihood determination units 1051 to 1054 of the likelihood generation device 1050 described in the third embodiment.

Next, based on the code rules for the n-bit signal, the likelihood generation unit 322 of the optical receiving apparatus 300 changes the likelihoods determined in step S62 to obtain likelihoods for the original (n−k)-bit signal (step S63). In cases where the optical transmission system 1 is the optical transmission system where 12b8D-2A8PSK is applied, n=16 and k=4. The process of step S63 is carried out by the likelihood correction units 1055, 1056, and 1057 of the likelihood generation device 1050 described in the third embodiment.

Next, the decoding processor 323 of the optical receiving apparatus 300 performs soft decision error correction decoding using the likelihoods for the (n−k)-bit signal that are input from the likelihood generation unit 322 (step S64). This process is the same as step S34 illustrated in FIG. 8.

According to each of the embodiments described, the likelihood generation device that can be achieved provides excellent efficiency in circuit implementation and thus can contribute to reduction of a size of the optical receiving apparatus.

The symbol rate per channel that is used for the present invention is assumed to range mainly between 1 Gsymbol/s and 100 Gsymbol/s, inclusive. However, the symbol rate for the present invention is not limited to the above range. Signals of different modulations or different symbol rates, or both can be mixed among a plurality of channels. Combination with sub-channel multiplexing is also possible in an optical or an electrical domain.

A likelihood generation device, a receiving apparatus, a likelihood generation method, and an optical transmission system according to the present invention are useful in large-capacity optical transmission.

The above configurations illustrated in the embodiments are examples of content of the present invention, can be combined with other techniques that are publicly known, and can be partly omitted or changed without departing from the gist of the present invention.

REFERENCE SIGNS LIST 1 optical transmission system; 20, 21 soft decision error correction decoder; 50, 1050 likelihood generation device; 51a, 51b, 1051 to 1054 temporary likelihood determination unit; 52, 1055 to 1057 likelihood correction unit; 53a to 53f, 1058a to 1058f, 1059a to 1059f quantizer; 61, 61A, 61B digital-to-analog converter; 62, 62A, 62B modulator driver; 63, 63A, 63B, 65 light source; 64, 64A, 64B polarization multiplexing I/Q optical modulator; 65A, 65B local oscillation light source; 66, 66A, 66B coherent receiver; 67, 67A, 67B analog-to-digital converter; 71A, 71B digital signal processing LSI; 81A, 81B (transmitting-end) digital processing circuit; 82A, 82B (receiving-end) digital processing circuit; 91 bit storage unit; 92 bit addition unit; 93 symbol assignment unit; 100 optical transmission apparatus; 110 transmitting-end electrical processing unit; 111 code processor; 112 mapping unit; 113 transmitting-end waveform processor; 120 optical-signal generation unit; 200 optical transmission unit; 201A, 201B optical fiber transmission line; 300 optical receiving apparatus; 310 optical-signal detector; 320 receiving-end electrical processing unit; 321 receiving-end waveform processor; 322 likelihood generation unit; 323 decoding processor; 401A, 401B optical communication apparatus.

The invention claimed is:

1. A likelihood generation device included in a receiving apparatus that receives a code-modulated signal including n-k information bits and k parity bits in N-dimensional arrangement, where N is a natural number greater than or equal to four, and n and k are natural numbers with k<n, the likelihood generation device comprising:
   a likelihood determiner to determine, by using a table that includes an L-dimensional address space and stores a likelihood in each of the L-dimensional address spaces, likelihoods of an information bit and a parity bit that are transmitted by the code-modulated signal received, where L is a natural number with L<N; and
   a likelihood corrector to update, among the likelihoods determined by the likelihood determiner, the likelihood of the information bit on a basis of a rule for generation of the parity bit.

2. The likelihood generation device according to claim 1, wherein:
   the code-modulated signal includes, as one block, four dimensions including two orthogonal polarizations, two orthogonal phases, and one time slot; and
   the likelihood determiner determines the likelihoods by using a plurality of tables that each include the two-dimensional address space and store likelihoods associated with different signal components.

3. The likelihood generation device according to claim 1, wherein:

the code-modulated signal includes, as one block, eight dimensions including two orthogonal polarizations, two orthogonal phases, and two time slots; and the likelihood determiner determines the likelihoods by using a plurality of tables that each include the two-dimensional address space and store likelihoods associated with different signal components.

4. The likelihood generation device according to claim 1, wherein the likelihood stored in the table is determined in consideration of at least one of noise distribution conceivable in a system where the code-modulated signal is transmitted, signal distortion conceivable in the system, and performance of error correction decoding performed using the likelihood updated by the likelihood corrector.

5. The likelihood generation device according to claim 4, wherein when the likelihood stored in the table is determined in consideration of the noise distribution, the noise distribution includes at least one of a distribution of additive white Gaussian noise, a distribution of light source phase noise that remains after signal processing, and a distribution of polarized wave interference noise.

6. The likelihood generation device according to claim 4, wherein when the likelihood stored in the table is determined in consideration of the signal distortion, the signal distortion includes at least one of a skew between an in-phase component and a quadrature component of the code-modulated signal, a power variation between the in-phase component and the quadrature component of the code-modulated signal, and a power variation between an X-polarization component and a Y-polarization component of the code-modulated signal.

7. The likelihood generation device according to claim 1, further comprising a quantizer to quantize each of the likelihoods updated by the likelihood corrector and to change a bit resolution of each of the likelihoods.

8. The likelihood generation device according to claim 1, wherein the table is rewritable.

9. A receiving apparatus comprising the likelihood generation device according to claim 1, wherein error correction decoding is carried out using a likelihood generated by the likelihood generation device.

10. A likelihood generation method of generating a likelihood of an information bit transmitted by a code-modulated signal, the method being carried out by a receiving apparatus that receives the code-modulated signal including n-k information bits and k parity bits in N-dimensional arrangement, where N is a natural number greater than or equal to four, and n and k are natural numbers with k<n, the method comprising:

a likelihood derivation of determining, by using a table that includes an L-dimensional address space and stores a likelihood in each of the L-dimensional address spaces, likelihoods of an information bit and a parity bit that are transmitted by the code-modulated signal received, where L is a natural number with L<N; and a likelihood updating of updating, among the likelihoods determined in the likelihood derivation, the likelihood of the information bit on a basis of a rule for generation of the parity bit.

11. The likelihood generation method according to claim 10, wherein the likelihood updating includes updating the likelihood of the information bit by using a min-sum method.

12. An optical transmission system comprising:

an optical transmission apparatus to generate a code-modulated signal including n-k information bits and k parity bits in N-dimensional arrangement and to transmit the code-modulated signal as an optical signal, where N is a natural number greater than or equal to four, and n and k are natural numbers with k<n; and an optical receiving apparatus to receive the optical signal, wherein the optical transmission apparatus includes:

a transmitting-end electrical processor to generate the code-modulated signal; and an optical-signal generator to convert the code-modulated signal in a form of an electrical signal to the optical signal, and the optical receiving apparatus includes:

an optical-signal detector to receive the optical signal transmitted by the optical transmission apparatus and to convert the optical signal to an electrical signal;

a likelihood determiner to receive the electrical signal from the optical-signal detector and to determine, by using a table that includes an L-dimensional address space and stores a likelihood in each of the L-dimensional address spaces, likelihoods of an information bit and a parity bit that are transmitted by the electrical signal received, where L is a natural number with L<N;

a likelihood corrector to update, among the likelihoods determined by the likelihood determiner, the likelihood of the information bit on a basis of a rule for generation of the parity bit; and a decoding processor to carry out error correction decoding using the likelihood updated by the likelihood corrector.

* * * * *